US012622325B2

(12) United States Patent
Park et al.

(10) Patent No.: US 12,622,325 B2
(45) Date of Patent: May 5, 2026

(54) DISPLAY DEVICE AND METHOD OF FABRICATING THE SAME

(71) Applicant: Samsung Display Co., LTD., Yongin-si (KR)

(72) Inventors: Young Min Park, Yongin-si (KR); Dong Hwan Kim, Yongin-si (KR); Jung Hoon Shin, Yongin-si (KR); Sang Won Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 580 days.

(21) Appl. No.: 18/057,681

(22) Filed: Nov. 21, 2022

(65) Prior Publication Data

US 2023/0326909 A1 Oct. 12, 2023

(30) Foreign Application Priority Data

Apr. 6, 2022 (KR) ........................ 10-2022-0042826

(51) Int. Cl.
| | |
|---|---|
| *H10H 20/00* | (2025.01) |
| *H01L 25/075* | (2006.01) |
| *H10H 20/852* | (2025.01) |
| *H10H 20/856* | (2025.01) |
| *H10H 20/01* | (2025.01) |

(52) U.S. Cl.
CPC ....... *H01L 25/0753* (2013.01); *H10H 20/852* (2025.01); *H10H 20/856* (2025.01); *H10H 20/0362* (2025.01); *H10H 20/0363* (2025.01)

(58) Field of Classification Search
CPC .... H10H 20/85; H10H 20/855; H10H 20/856; H10H 20/0362; H10H 20/0363; H01L 25/0753
See application file for complete search history.

(56) References Cited

U.S. PATENT DOCUMENTS

| | | | |
|---|---|---|---|
| 2014/0319500 A1 | 10/2014 | Adachi et al. | |
| 2016/0260862 A1* | 9/2016 | Kugiyama | ........... H10H 20/854 |
| 2020/0105826 A1* | 4/2020 | Kim | .................... H01L 25/0753 |

FOREIGN PATENT DOCUMENTS

| | | |
|---|---|---|
| JP | 2014-56666 A | 3/2014 |
| JP | 2021-152704 A | 9/2021 |
| KR | 10-2016-0062661 A | 6/2016 |
| KR | 10-2016-0065667 A | 6/2016 |
| KR | 10-2017-0051640 A | 5/2017 |
| KR | 10-2020-0051911 A | 5/2020 |
| KR | 10-2021-0040073 A | 4/2021 |
| KR | 10-2297644 B1 | 9/2021 |
| KR | 10-2022-0018411 A | 2/2022 |

* cited by examiner

*Primary Examiner* — Reema Patel

(74) *Attorney, Agent, or Firm* — Womble Bond Dickinson (US) LLP

(57) ABSTRACT

A display device includes: a substrate including a plurality of pixels; and a light-emitting element layer on the substrate. The light-emitting element layer includes: light-emitting elements in each pixel, configured to emit light, and arranged along a first direction; viewing angle control portions respectively on the light-emitting elements; and reflecting portions respectively on one side and another side of the light-emitting elements in a second direction crossing the first direction in a plan view

19 Claims, 28 Drawing Sheets

DTL1: CE1 ACT: TCH, TS, TD
DTL2: CE2 GTL1: TG, CAE1
DTL3: CE3 GTL2: CAE2
DTL4: APD, CPD

DTL1: CE1          ACT: TCH, TS, TD
DTL2: CE2          GTL1: TG, CAE1
DTL3: CE3          GTL2: CAE2
DTL4: APD, CPD

DTL1: CE1     ACT: TCH, TS, TD
DTL2: CE2     GTL1: TG, CAE1
DTL3: CE3     GTL2: CAE2
DTL4: APD, CPD

DISPLAY DEVICE AND METHOD OF FABRICATING THE SAME

CROSS-REFERENCE TO RELATED APPLICATION

This application claims priority to and the benefit of Korean Patent Application No. 10-2022-0042826, filed on Apr. 6, 2022, in the Korean Intellectual Property Office, the contents of which are herein incorporated by reference in their entirety.

BACKGROUND

1. Field

Aspects of embodiments of the present disclosure relate to a display device and a method of fabricating the same.

2. Description of the Related Art

With the advancement of the information society, the demand for display devices for displaying images in various forms is increasing. Examples of such display devices include flat panel display devices, including liquid crystal display (LCD) devices, field emission display (FED) devices, light emitting display devices, and the like. Light emitting display devices include an organic light emitting display device including an organic light-emitting element or light emitting diode display device including an inorganic light emitting diode element, such as a light emitting diode (LED) as a light-emitting element.

In the case of a display device for a vehicle that is located in front of a driver or passenger, an image displayed on the display device may be visible as a reflection on the windshield at nighttime. When this occurs, the reflected image may distract the driver. Also, when the passenger views an image via the display device and the image is exposed to (or visible to) the driver, the image may disturb the driver and impact the driver's driving ability and focus.

SUMMARY

Aspects of the present disclosure provide a display device configured to control a vertical viewing angle.

However, aspects of the present disclosure are not restricted to those set forth herein. The above and other aspects of the present disclosure will become more apparent to one of ordinary skill in the art to which the present disclosure pertains by referencing the detailed description of the present disclosure below.

According to an embodiment of the present disclosure, a display device includes: a substrate including a plurality of pixels; and a light-emitting element layer on the substrate. The light-emitting element layer includes: light-emitting elements in each pixel, configured to emit light, and arranged along a first direction; viewing angle control portions respectively on the light-emitting elements; and reflecting portions respectively on one side and another side of the light-emitting elements in a second direction crossing the first direction in a plan view.

Each of the viewing angle control portions may include a first layer having a first refractive index and a second layer having a second refractive index that is smaller than the first refractive index.

Each of the first layer and the second layer may be provided in plural.

The plurality of first layers and the plurality of second layers may be alternately stacked on each other.

A difference between the first refractive index and the second refractive index may be 0.3 or more.

The viewing angle control portions on the respective light-emitting elements may be spaced apart from one another.

The reflecting portions include may an opaque reflective material.

The opaque reflective material may include resin including white-color-based pigments.

A reflectance of the reflecting portions with respect to the light emitted from each of the light-emitting elements may be 80% or more.

The reflecting portions may be in direct contact with adjacent the light-emitting elements.

The light-emitting element layer may further include light-transmitting portions filling between the light-emitting elements and the reflecting portions in a plan view.

The light-transmitting portions may include transparent resin.

A light transmittance of the light-transmitting portions with respect to the light emitted from each of the light-emitting elements may be 90% or more.

According to another embodiment of the present disclosure, a display device includes: a substrate including a pixel, the pixel including a first sub-pixel, a second sub-pixel, and a third sub-pixel, the first to third sub-pixels being arranged in a first direction, and a light-emitting element layer on the substrate. The light-emitting element layer includes: a first light-emitting element on the first sub-pixel; a second light-emitting element on the second sub-pixel; a third light-emitting element on the third sub-pixel; a first viewing angle control portion on the first light-emitting element; a second viewing angle control portion on the second light-emitting element; a third viewing angle control portion on the third light-emitting element; and reflecting portions respectively on one side and another side the first light-emitting element, the second light-emitting element, and the third light-emitting element in a second direction crossing the first direction in a plan view.

The first light-emitting element may be configured to emit a first light, the second light-emitting element may be configured to emit a second light, and the third light-emitting element may be configured to emit a third light. A wavelength of the third light may have a value between a wavelength of the first light and a wavelength of the second light, and the wavelength of the second light may be greater than the wavelength of the first light.

The first viewing angle control portion may have a first thickness, the second viewing angle control portion may have a second thickness, and the third viewing angle control portion may have a third thickness. The third thickness may have a value between the first thickness and the second thickness, and the second thickness may be greater than the first thickness.

Each of the first viewing angle control portion, the second viewing angle control portion, and the third viewing angle control portion may include a first layer having a first refractive index and a second layer having a second refractive index that is smaller than the first refractive index. Each of the first layer and the second layer may be provided in plural, and the plurality of first layers and the plurality of second layers may be alternately stacked on each other.

A difference between the first refractive index and the second refractive index may be 0.3 or more.

According to another embodiment of the present disclosure, a method of fabricating a display device includes disposing a light-emitting element layer on a substrate, the substrate including a plurality of pixels. The disposing of the light-emitting element includes: disposing light-emitting elements in each pixel arranged in a first direction, the light-emitting elements being configured to emit light, and viewing angle control portions respectively on the light-emitting elements; disposing reflecting portions respectively on one side and another side of the light-emitting elements in a second direction crossing the first direction in a plan view; and disposing and filling light-transmitting portions between the light-emitting elements and the reflecting portions in a plan view.

The disposing of the light-emitting elements and the viewing angle control portions may include: forming target light-emitting elements on one surface of a mother substrate; disposing a viewing angle control layer on the other surface that is opposite to the one surface of the mother substrate; and disposing the light-emitting elements and the viewing angle control portions in each of the pixels by cutting the mother substrate and the viewing angle control layer.

Aspects and features of the present disclosure are not limited to those described above, and other aspects and features of the present disclosure will be apparent from the following description.

BRIEF DESCRIPTION OF THE DRAWINGS

The above and other aspects and features of the present disclosure will become more apparent by describing, in detail, embodiments thereof with reference to the attached drawings, in which.

4

Figure 14:
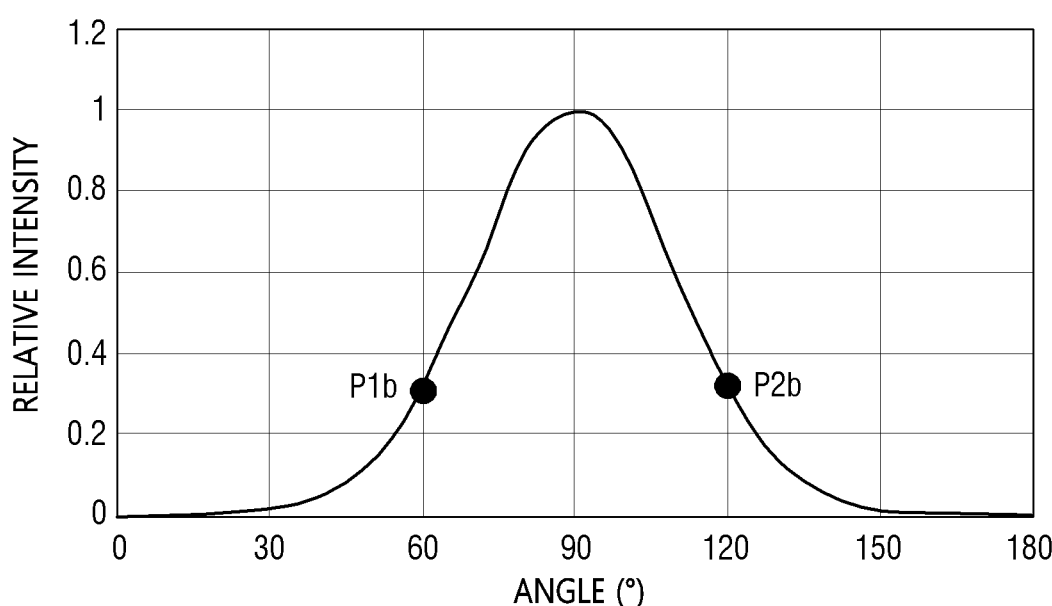
Figure 15:
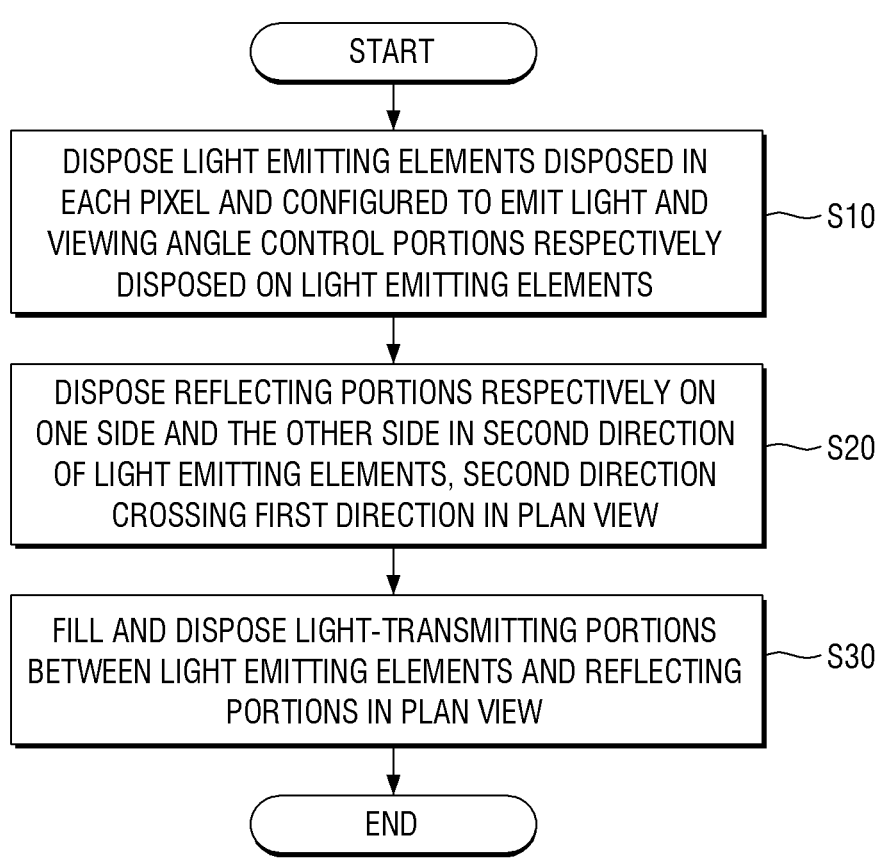
Figure 21:
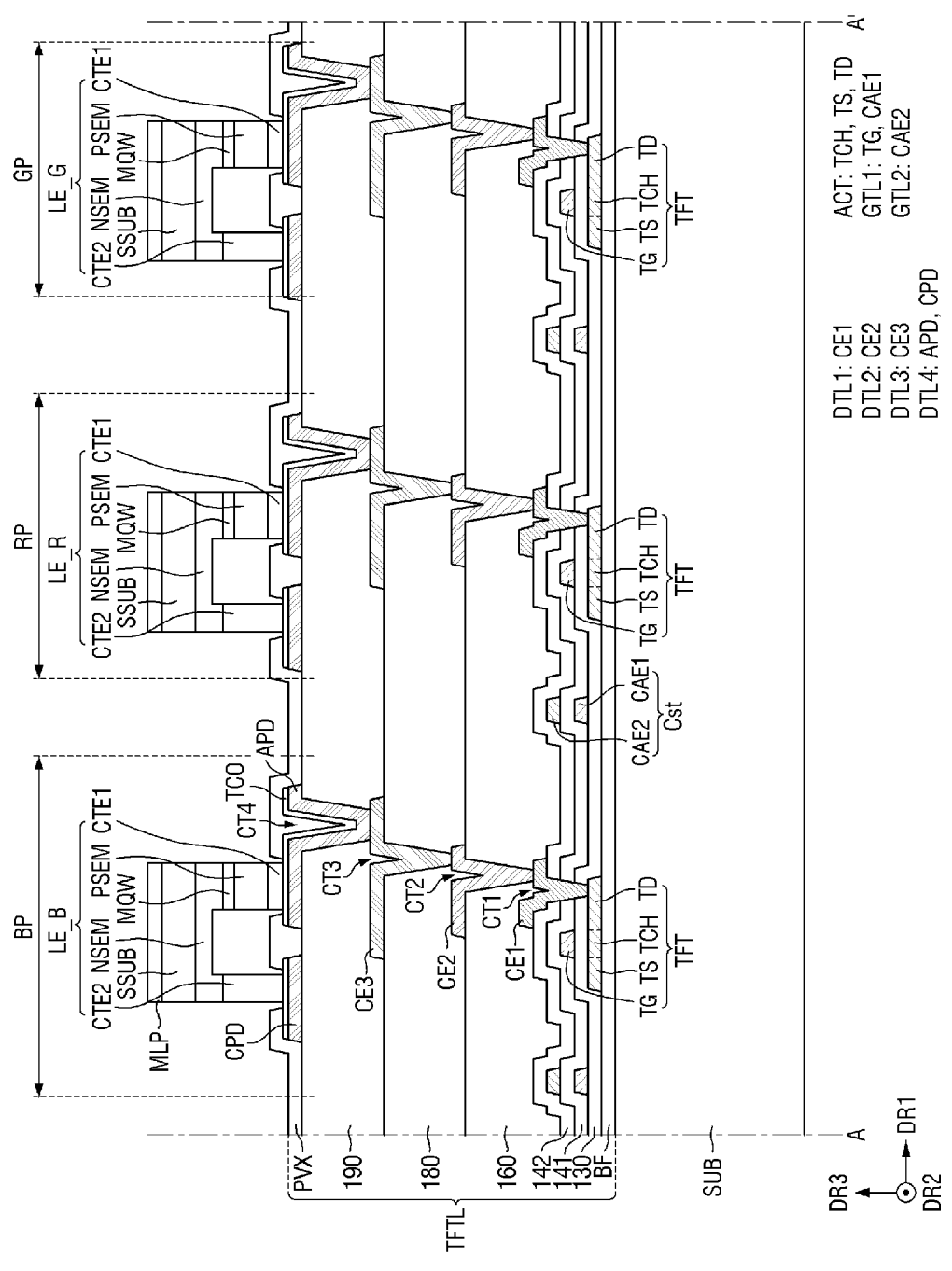
Figure 22:
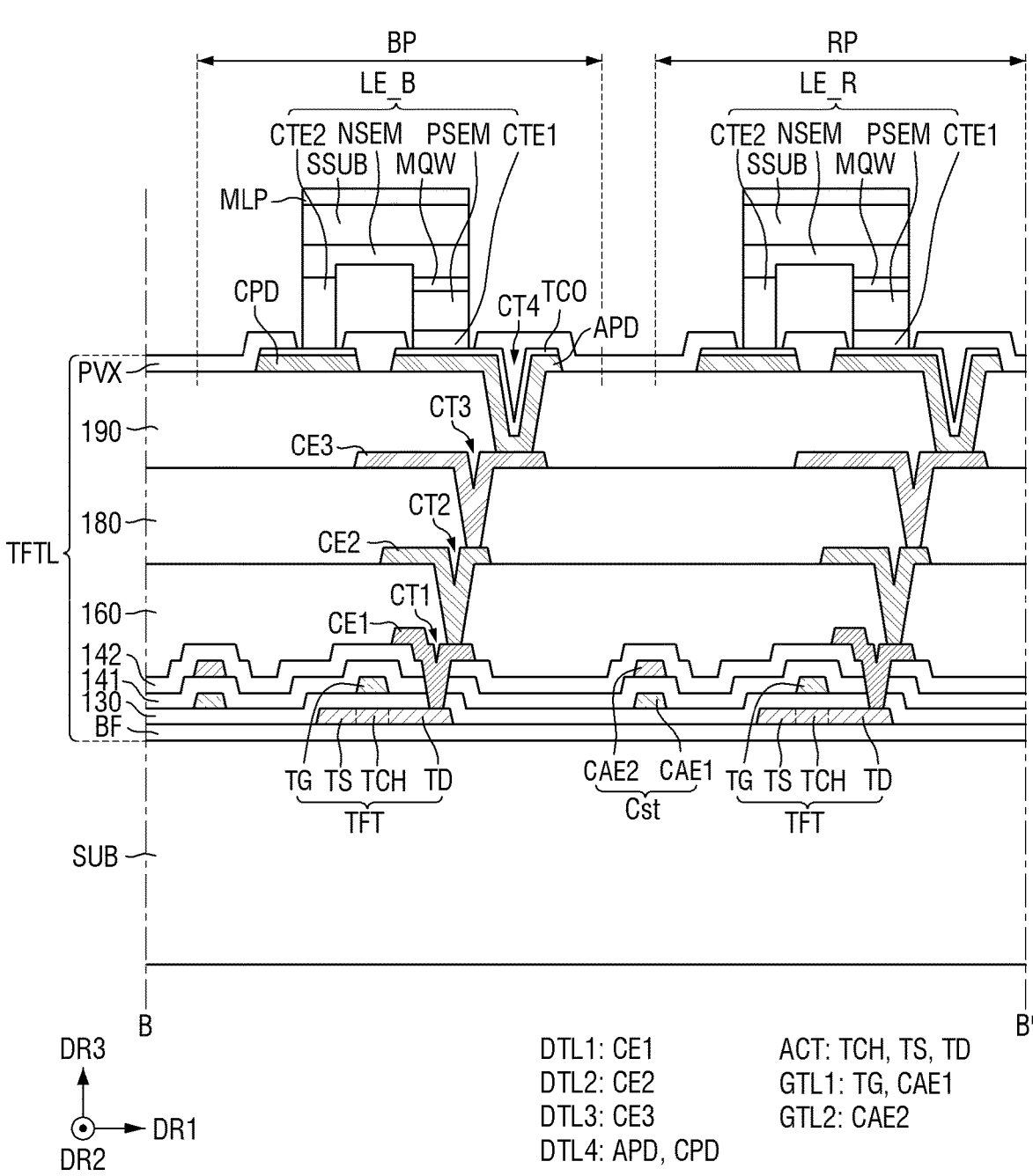
Figure 24:
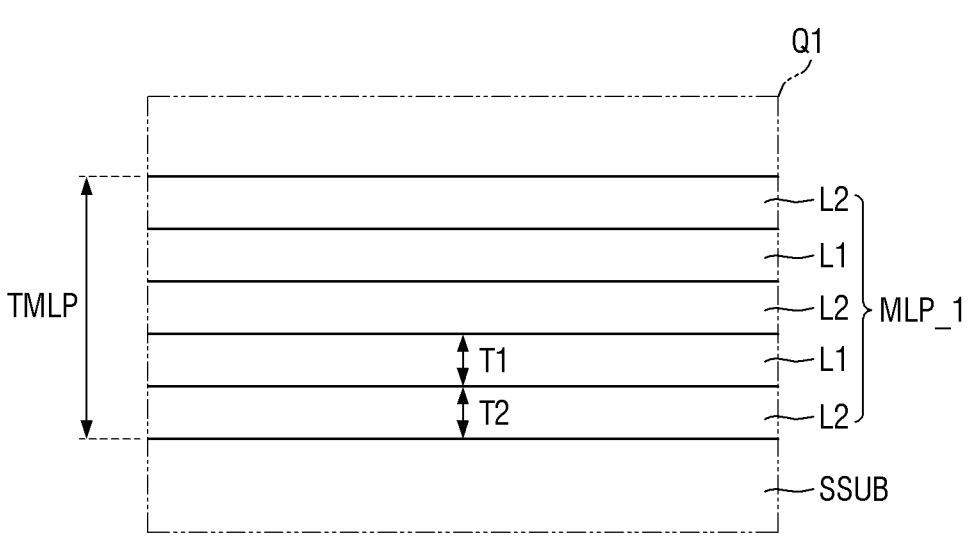
Figure 25:
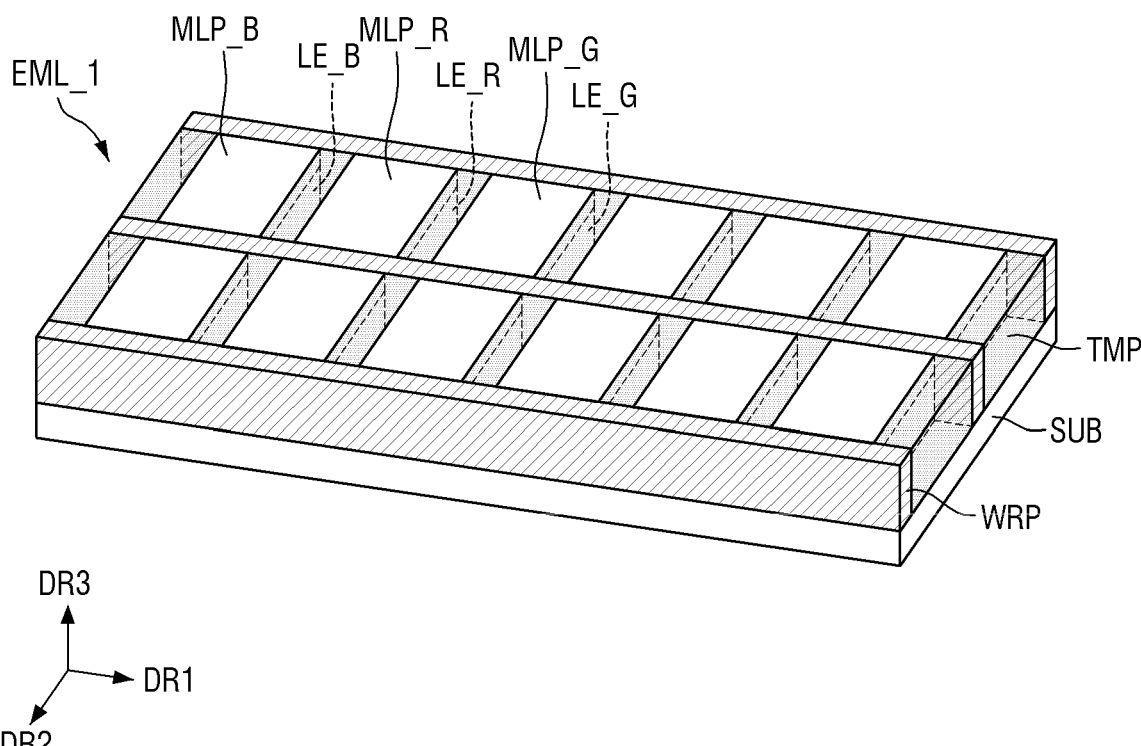
Figure 26:
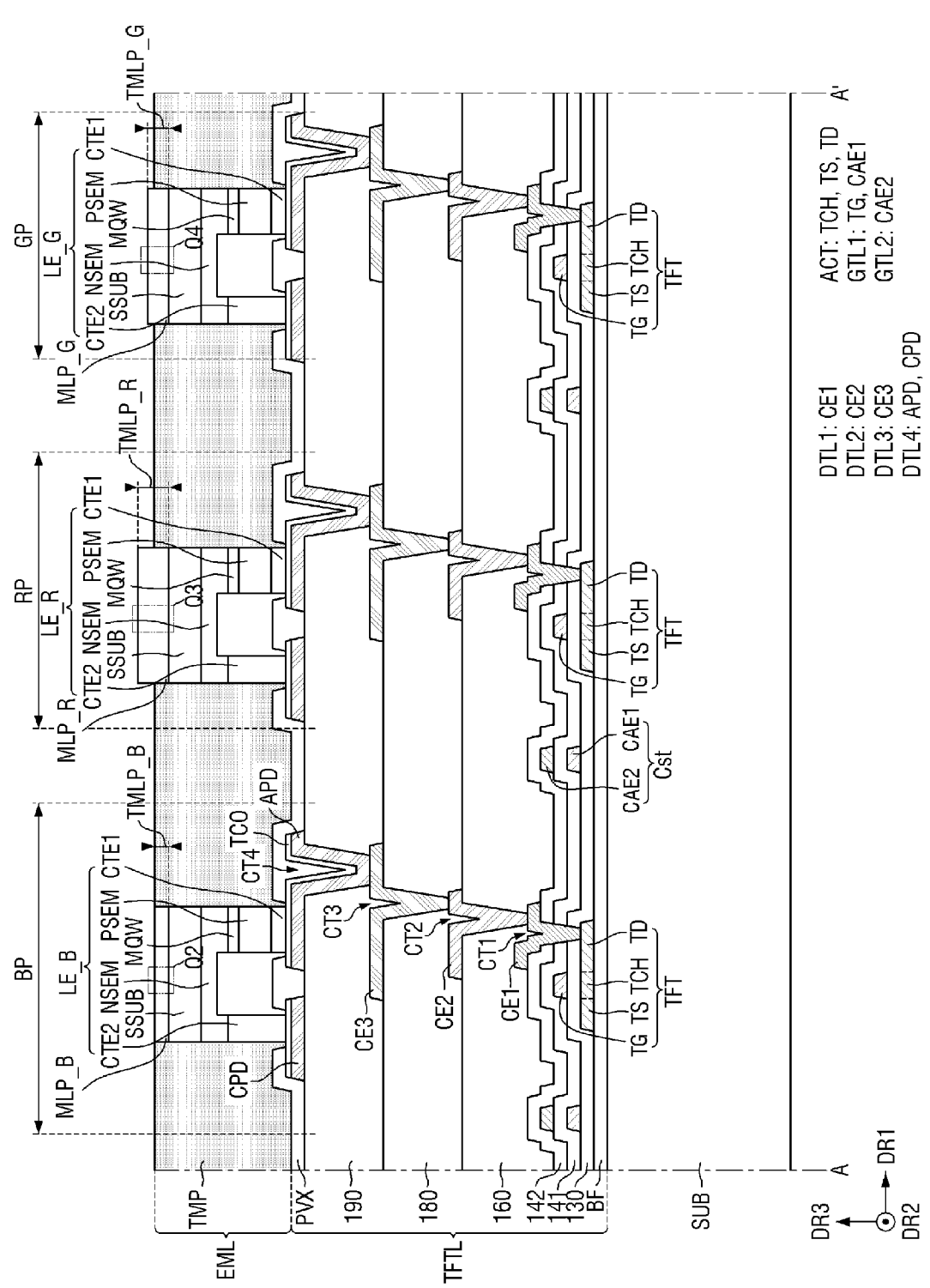
Figure 27:
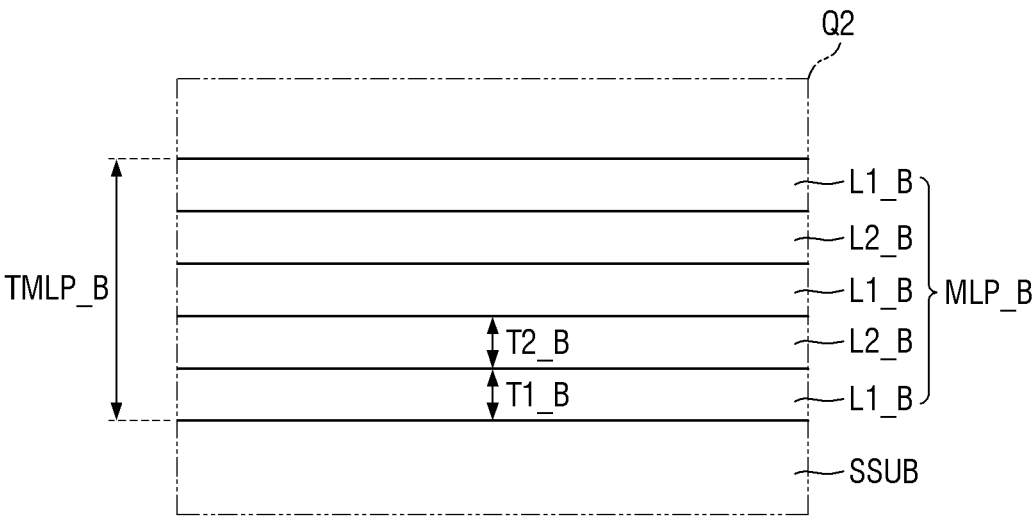
Figure 28:
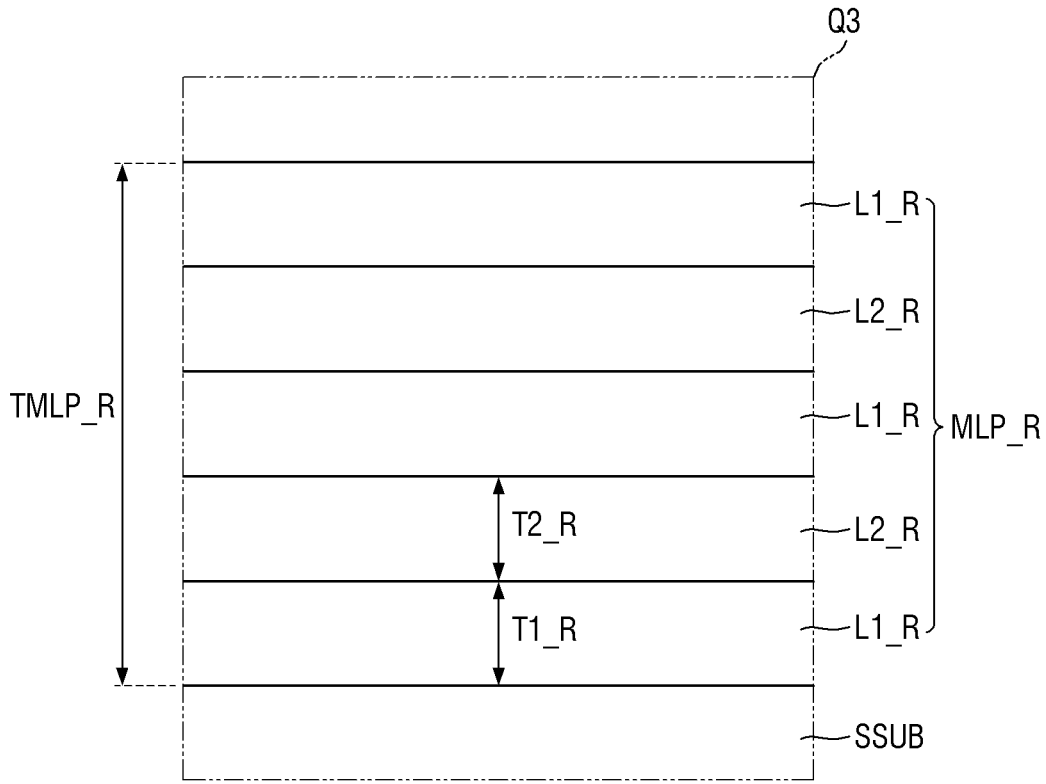
Figure 29:
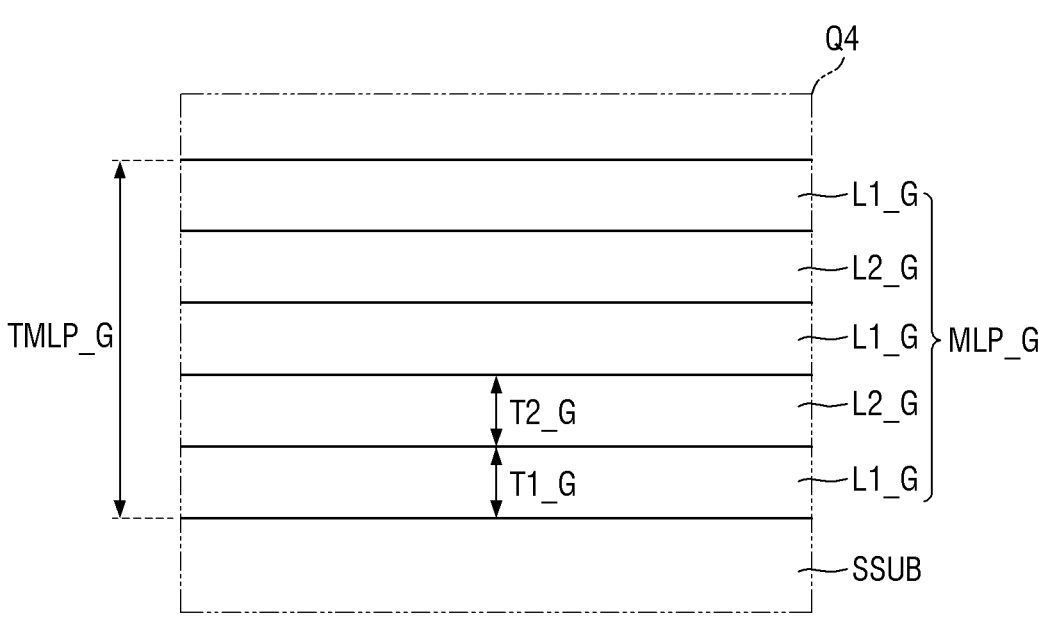

FIG. 14 is a graph showing the relative intensity of light according to an angle when a reflecting portion according to an embodiment is applied;

FIG. 15 is a flowchart describing a method of fabricating a display device according to an embodiment;

FIGS. 16 to 20 and 23 are perspective views showing processing steps of a method of fabricating a display device according to an embodiment;

FIGS. 21 and 22 are cross-sectional views showing processing steps of a method of fabricating a display device according to an embodiment;

FIG. 24 is a cross-sectional view of a light-emitting element layer of a display device according to another embodiment;

FIG. 25 is a perspective view of a display device according to another embodiment;

FIG. 26 is a cross-sectional view of the display device according to another embodiment;

FIG. 27 is an enlarged cross-sectional view of the portion Q2 of FIG. 26;

FIG. 28 is an enlarged cross-sectional view of the portion Q3 of FIG. 26; and FIG. 29 is an enlarged cross-sectional view of the portion Q4 of FIG. 26.

DETAILED DESCRIPTION

Embodiments of the present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Embodiments are described herein with reference to cross section illustrations that are schematic illustrations of idealized embodiments. As such, variations from the shapes of the illustrations as a result of, for example, manufacturing techniques and/or tolerances, are to be expected. Thus, embodiments described herein should not be construed as limited to the particular shapes of regions as illustrated herein but are to include deviations in shapes that result from, for example, manufacturing. A region illustrated or described as flat may, typically, have rough and/or nonlinear features, for example. Moreover, sharp angles that are illustrated may be rounded. Thus, the regions illustrated in the drawing figures are schematic in nature and their shapes are not intended to illustrate the precise shape of a region and are not intended to limit the scope of the claims.

Hereinafter, embodiments of the present disclosure will be described with reference to the attached drawings.

Figure 1:
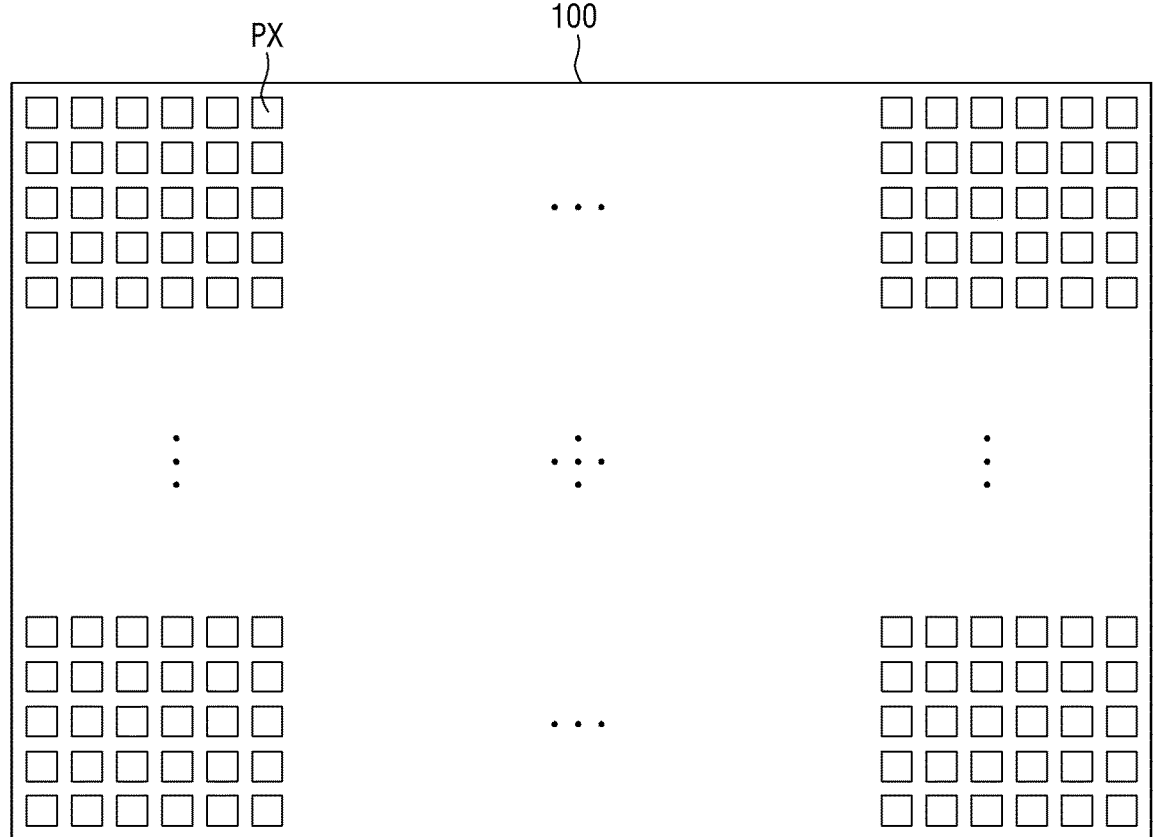
FIG. 1 is a plan view of a display device according to an embodiment.
Figure 1:
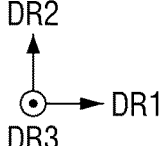
Figure 2:
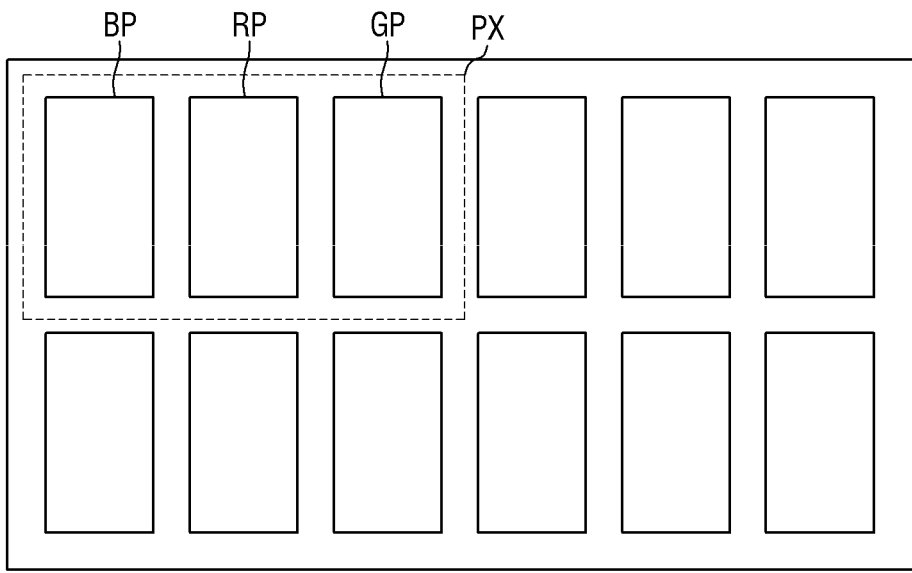
FIG. 2 is a plan view showing pixels of FIG. 1 in more detail.
Figure 2:
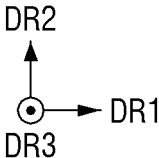

FIG. 1 is a plan view of a display device according to an embodiment, and FIG. 2 is a view of an example of a pixel of the display device shown in FIG. 1 in more detail.

Referring to FIGS. 1 and 2, a display device 100 is for displaying (e.g., s configured to display) moving images and/or still images. The display device 100 may be used as the display screen of portable electronic devices, such as a mobile phone, a smart phone, a tablet personal computer (PC), a smart watch, a watch phone, a mobile communications terminal, an electronic notebook, an electronic book, a portable multimedia player (PMP), a display for a vehicle, and an ultra-mobile PC (UMPC), as well as the display screen of various products, such as a television, a notebook, a monitor, a billboard, and an Internet of Things (IoT) device.

The display device 100 may have a rectangular planar shape having long sides in a first direction DR1 and short sides in a second direction DR2 that crosses (e.g., is perpendicular to) the first direction DR1. The corner where the long side in the first direction DR1 meets the short side in the second direction DR2 may be formed to have a round (or rounded) shape with a curvature (e.g., a predetermined curvature) or a right angle shape. The planar shape of the display device 100 is not limited to a rectangular shape, and the display device 100 may have another polygonal shape, a circular shape, or an elliptical shape The display device 100 may be formed to be flat but is not limited thereto. For example, the display device 100 may include a curved portion formed at left and right ends. In such an embodiment, the curved portion may have a constant curvature or a variable curvature. Further, the display device 100 may be formed to be flexible such that it can be bent, unbent, warped, unwarped, folded, unfolded, rolled, and/or unrolled.

Each of pixels PX may include a plurality of sub-pixels RP, GP, and BP as shown in FIG. 2. In FIG. 2, each of the pixels PX includes three sub-pixels RP, GP, and BP (e.g., a first sub-pixel BP, a second sub-pixel RP, and a third sub-pixel GP). However, embodiments of the present disclosure are not limited thereto. Further, in FIG. 2, the sub-pixels BP, RP, and GP are illustrated as being arranged along the first direction DR1 but are not limited thereto. In other embodiments, the order of the sub-pixels may be changed.

Each of the first sub-pixel BP, the second sub-pixel RP, the third sub-pixel GP may have a rectangular, square, or rhombus planar shape. For example, each of the first sub-pixel BP, the second sub-pixel RP, and the third sub-pixel GP may have a rectangular shape having short sides in the first direction DR1 and long sides in the second direction DR2, as shown in FIG. 2.

In some embodiments, each of the first sub-pixel BP, the second sub-pixel RP, and the third sub-pixel GP may have a square or rhombus planar shape having sides of the same length in the first direction DR1 and the second direction DR2.

As shown in FIG. 2, the first sub-pixel BP, the second sub-pixel RP, and the third sub-pixel GP may be arranged in the first direction DR1. In other embodiments, any one of the second sub-pixel RP, the third sub-pixel GP, and the first sub-pixel BP may be arranged in the first direction DR1, and the other sub-pixel and the first sub-pixel BP may be arranged in the second direction DR2. For example, the first sub-pixel BP and the second sub-pixel RP may be arranged in the first direction DR1, and the first sub-pixel BP and the third sub-pixel GP may be arranged in the second direction DR2.

In some embodiments, any one of the first sub-pixel BP and the third sub-pixel GP and the second sub-pixel RP may be arranged in the first direction DR1 and the other sub-pixel and the second sub-pixel RP may be arranged in the second direction DR2. In other embodiments, any one of the first sub-pixel BP and the second sub-pixel RP and the third sub-pixel GP may be arranged in the first direction DR1 and the other sub-pixel and the third sub-pixel GP may be arranged in the second direction DR2.

The first sub-pixel BP may emit first light, the second sub-pixel RP may emit second light, and the third sub-pixel GP may emit third light. Here, the first light may be light in the blue wavelength range, the second light may be light in the red wavelength range, and the third light may be light in the green wavelength range. The green wavelength range may be a wavelength range of approximately 600 nm to approximately 750 nm, the green wavelength range may be a wavelength range of approximately 480 nm to approximately 560 nm, and the blue wavelength range may be a wavelength range of approximately 370 nm to approximately 460 nm. However, embodiments of the present disclosure are not limited thereto.

Each of the first sub-pixel BP, the second sub-pixel RP, and the third sub-pixel GP may include, as a light-emitting element, an inorganic light-emitting element LE_B, LE_R, and LE_G (see, e.g., FIG. 4) having an inorganic semiconductor. For example, the inorganic light-emitting element may be a flip-chip type micro light emitting diode (LED), but embodiments of the present disclosure are not limited thereto.

As shown in FIGS. 1 and 2, the first sub-pixel BP, the second sub-pixel RP, and the third sub-pixel GP may have substantially the same area (e.g., the same planar size), but embodiments of the present disclosure are not limited thereto. At least one of the first sub-pixel BP, the second sub-pixel RP, or the third sub-pixel GP may have an area different from that of another sub-pixel. In other embodiments, any two of the first sub-pixel BP, the second sub-pixel RP, and the third sub-pixel GP may have substantially the same area, and the other sub-pixel may have the area different from that of the two sub-pixels. In other embodiments, the first sub-pixel BP, the second sub-pixel RP, and the third sub-pixel GP may have different areas from one another.

Figure 3:
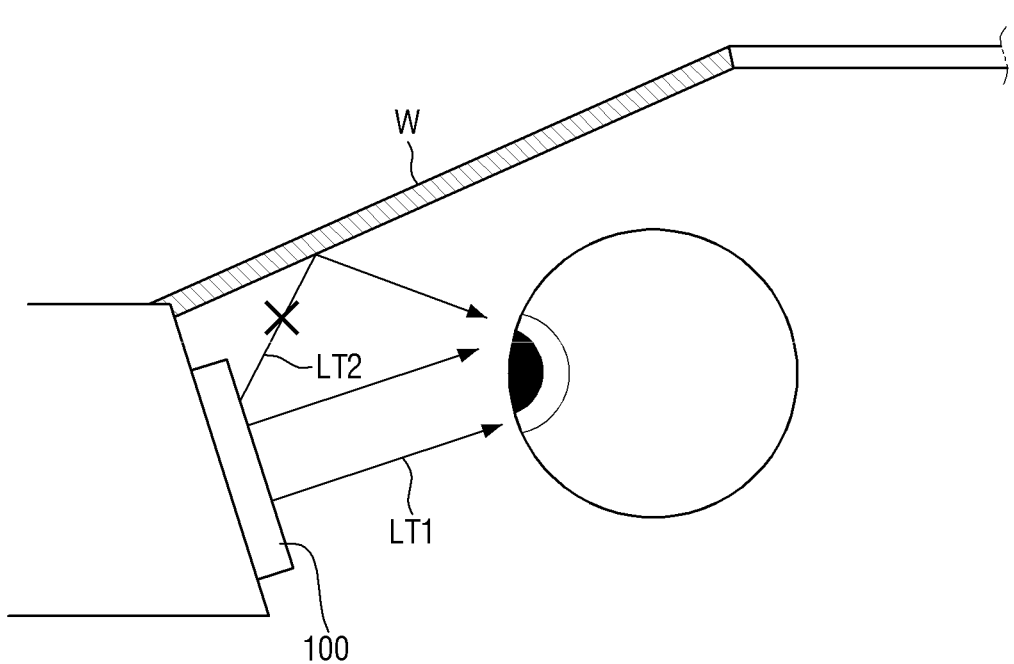
FIG. 3 is a schematic diagram illustrating an example in which the display device shown in FIG. 1 is applied to a vehicle.

FIG. 3 is a schematic diagram illustrating an example in which the display device of FIG. 1 is applied to (e.g., is installed in) a vehicle.

Referring to FIG. 3, the display device 100 according to an embodiment may be display device applied to, for example, a vehicle. The vehicle may include a vehicle body forming an outer edge of the vehicle and an interior space defined by the vehicle body. The vehicle body may include a windshield W for protecting the driver and the passenger(s) from outside and providing a view for the driver. As shown in FIG. 3, the display device 100 may be provided in the interior space.

In one embodiment, the display device 100 may be disposed on a dashboard provided in the interior space. For example, the display device 100 may be disposed on the dashboard in front of a driver seat to provide speed information or the like to the driver, may be disposed on the dashboard in front of a passenger seat to provide entertainment information or the like to the passenger, or may be disposed on the center of the dashboard to provide navigation information or the like. In FIG. 3, the display device 100 is disposed on the center of the dashboard, and the driver is viewing a display screen of the display device 100.

The driver may recognize (or view) the display screen of the display device 100 through light LT1 emitted from the display device 100 and not reflected by the adjacent windshield W. However, part LT2 of the light emitted from the display device 100 may be reflected by the adjacent windshield W and provided to the driver. In this case, an image reflected on the windshield W may disturb the driver and affect his driving. However, in the display device 100 according to an embodiment, by adjusting the viewing angles in the forward direction (e.g., the direction toward the front of the driver) of the lights LT1 and LT2 emitted from the display device 100, in particular, the vertical viewing angles, the part LT2 of the light emitted from the display device 100 that is usually reflected by the adjacent windshield W and provided to the driver may not be emitted by the display device 100. The vertical viewing angles may be adjusted by using a viewing angle control portion MLP and a reflecting portion WRP, which will be described below with reference to FIGS. 4 to 6. The vertical viewing angles are limited to a angular range (e.g., a predetermined angular range) by the viewing angle control portion MLP and the reflecting portion WRP to prevent, in advance, that the part LT2 of the light emitted from the display device 100 that is reflected by the adjacent windshield W and provided to the driver from being emitted by the display device 100.

Figure 4:
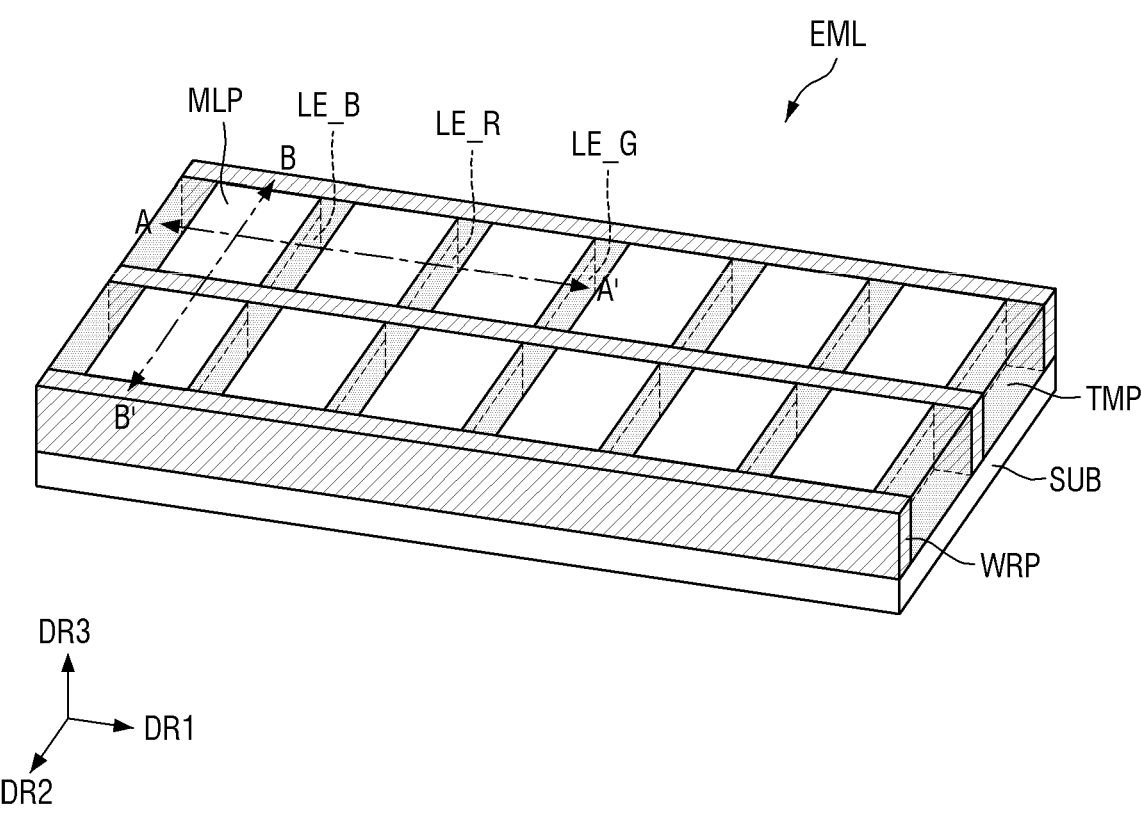
FIG. 4 is a perspective view showing a substrate and a light-emitting element layer of the display device shown in FIG. 1.
Figure 5:
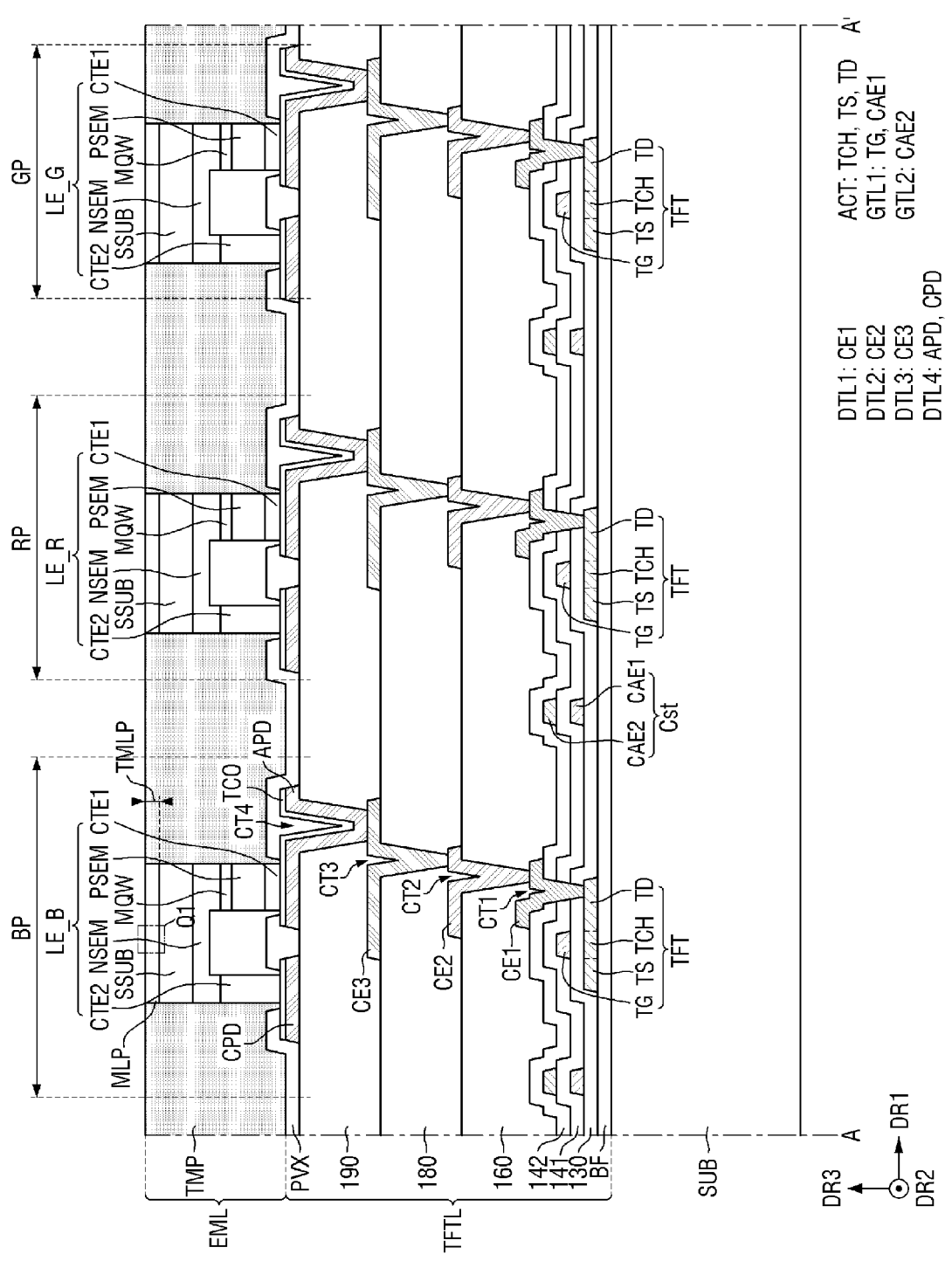
FIG. 5 is a cross-sectional view taken along the line A-A' of FIG. 4.
Figure 6:
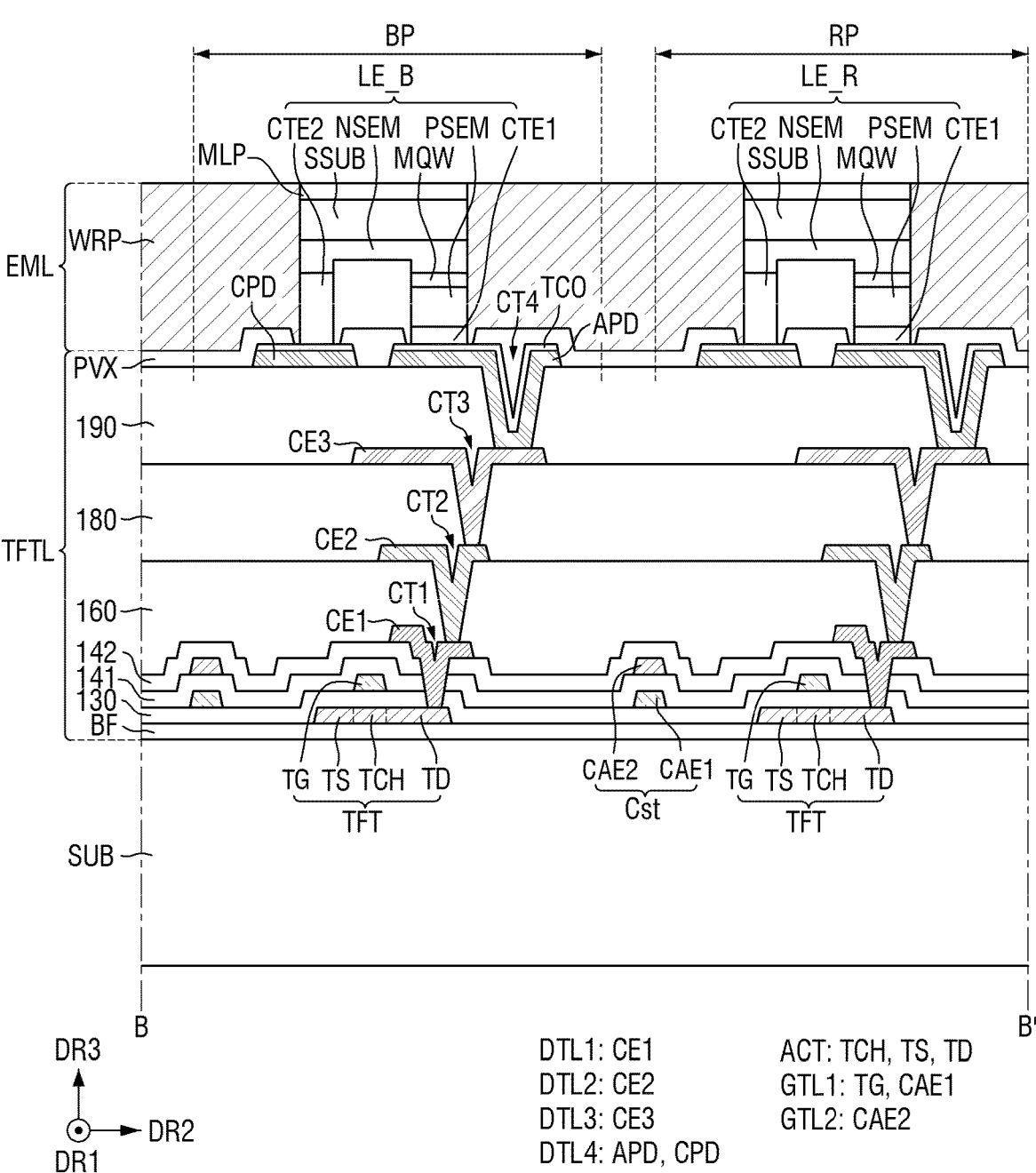
FIG. 6 is a cross-sectional view taken along the line B-B' of FIG. 4.
Figure 7:
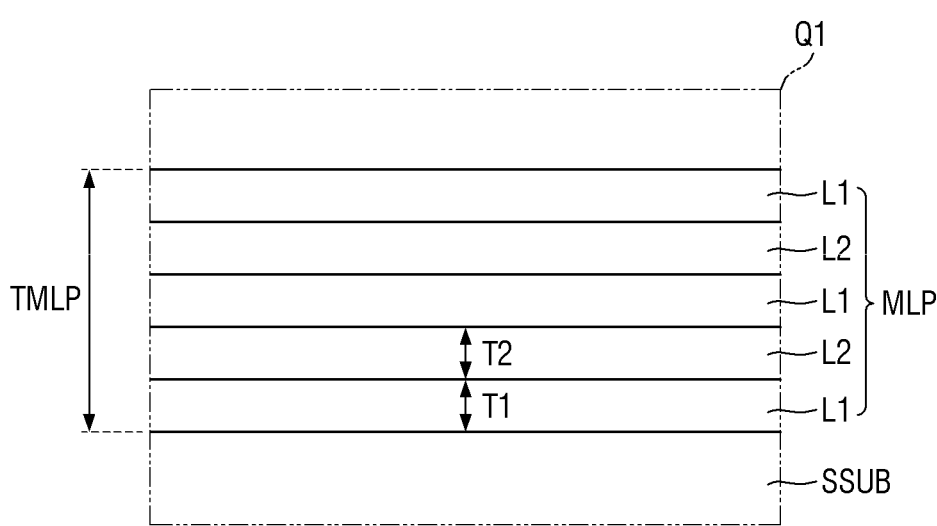
FIG. 7 is an enlarged cross-sectional view of the portion Q1 of FIG. 5.

FIG. 4 is a perspective view showing a substrate and a light-emitting element layer of the display device shown in FIG. 1, FIG. 5 is a cross-sectional view taken along the line A-A' of FIG. 4, FIG. 6 is a cross-sectional view taken along the line B-B' of FIG. 4, and FIG. 7 is an enlarged cross-sectional view of the portion Q1 of FIG. 5.

Referring to FIGS. 4 to 7, the display device 100 according to an embodiment may include a substrate SUB, a thin film transistor layer TFTL on the substrate SUB, and a light-emitting element layer EML on the thin film transistor layer TFTL. In FIG. 4, the light-emitting element layer EML is illustrated as being directly disposed on the substrate SUB for convenience of description. However, in practice, the thin film transistor layer TFTL may be disposed between the substrate SUB and the light-emitting element layer EML as shown in FIGS. 5 and 6. The light-emitting element layer EML may include a plurality of light-emitting elements LE_B, LE_R, and LE_G.

The thin film transistor layer TFTL includes an active layer ACT, a first gate layer GTL1, a second gate layer GTL2, a first data metal layer DTL1, a second data metal layer DTL2, a third data metal layer DTL3, and a fourth data metal layer DTL4. The thin film transistor layer TFTL may additionally include a buffer layer BF, a gate insulating layer 130, a first interlayer insulating layer 141, a second interlayer insulating layer 142, a first planarization layer 160, a first insulating layer 161, a second planarization layer 180, and a second insulating layer 181.

The substrate SUB may be a base substrate or a base member to support the display device 100. The substrate SUB may be a rigid substrate made of, for example, glass, but embodiments of the present disclosure are not limited thereto. In other embodiments, the substrate SUB may be a flexible substrate that may be bent, folded, rolled, or the like. In such an embodiment, the substrate SUB may include an insulating material, such as a polymer resin (e.g., polyimide (PI)).

The buffer layer BF may be disposed on one surface of the substrate SUB. The buffer layer BF may prevent permeation of air or moisture. The buffer layer BF may include a plurality of inorganic layers alternately stacked. For example, the buffer layer BF may be a multi-layer structure in which one or more inorganic layers are alternately stacked, and the inorganic layers may include a silicon nitride layer, a silicon oxynitride layer, a silicon oxide layer, a titanium oxide layer, and an aluminum oxide layer. In some embodiments, the buffer layer BF may be omitted.

The active layer ACT may be disposed on the buffer layer BF. The active layer ACT may include a silicon semiconductor, such as polycrystalline silicon, monocrystalline silicon, low-temperature polycrystalline silicon, and amorphous silicon, or may include an oxide semiconductor.

The active layer ACT may include a channel TCH of a thin film transistor TFT, a first electrode TS, and a second electrode TD. The channel TCH of the thin film transistor TFT may be a region that overlaps a gate electrode TG of the thin film transistor TFT in a third direction DR3, that is, a thickness direction of the substrate SUB. A first electrode TS of the thin film transistor TFT may be disposed at one side of the channel TCH, and a second electrode TD of the thin film transistor TFT may be disposed at the other side of the channel TCH. The first electrode TS and the second electrode TD of the thin film transistor TFT may be regions that do not overlap the gate electrode TG of the thin film transistor TFT in the third direction DR3. The first electrode TS and the second electrode TD of the thin film transistor TFT may each be a region where a silicon semiconductor or an oxide semiconductor is doped with ions to have conductivity.

The gate insulating layer 130 may be disposed on the active layer ACT. The gate insulating layer 130 may be an inorganic layer, such as, for example, a silicon nitride layer, a silicon oxynitride layer, a silicon oxide layer, a titanium oxide layer, or an aluminum oxide layer.

The first gate layer GTL1 may be disposed on the gate insulating layer 130. The first gate layer GTL1 may include the gate electrode TG of the thin film transistor TFT and a first capacitor electrode CAE1. The first gate layer GTL1 may be a single layer or a multilayer made of any one or more of, for example, molybdenum (Mo), aluminum (Al), chromium (Cr), gold (Au), titanium (Ti), nickel (Ni), neodymium (Ne), copper (Cu), and alloys of the same.

The first interlayer insulating layer 141 may be disposed on the first gate layer GTL1. The first interlayer insulating layer 141 may be an inorganic layer, such as, for example, a silicon nitride layer, a silicon oxynitride layer, a silicon oxide layer, a titanium oxide layer, or an aluminum oxide layer.

The second gate layer GTL2 may be disposed on the first interlayer insulating layer 141. The second gate layer GTL2 may include a second capacitor electrode CAE2. The second gate layer GTL2 may be a single layer or a multilayer made of any one or more of, for example, molybdenum (Mo), aluminum (Al), chromium (Cr), gold (Au), titanium (Ti), nickel (Ni), neodymium (Ne), copper (Cu), and alloys of the same.

The second interlayer insulating layer 142 may be disposed on the second gate layer GTL2. The second interlayer insulating layer 142 may be an inorganic layer, such as, for example, a silicon nitride layer, a silicon oxynitride layer, a silicon oxide layer, a titanium oxide layer, or an aluminum oxide layer.

The first data metal layer DTL1 may be disposed on the second interlayer insulating layer 142. The first data metal layer DTL1 includes a first connection electrode CE1. The first data metal layer DTL1 may be a single layer or a multilayer made of any one or more of, for example, molybdenum (Mo), aluminum (Al), chromium (Cr), gold (Au), titanium (Ti), nickel (Ni), neodymium (Ne), copper (Cu), and alloys of the same.

The first connection electrode CE1 may be connected to the first electrode TS or the second electrode TD of the thin film transistor TFT through a first contact hole (e.g., a first contact opening) CT1 penetrating the first interlayer insulating layer 141 and the second interlayer insulating layer 142.

A first planarization layer 160 for planarizing a step height (or a step difference) caused by the active layer ACT, the first gate layer GTL1, the second gate layer GTL2, and the first data metal layer DTL1 may be disposed on the first data metal layer DTL1. The first planarization layer 160 may be an organic layer, such as acryl resin, epoxy resin, phenolic resin, polyamide resin, or polyimide resin.

The second data metal layer DTL2 may be disposed on the first planarization layer 160. The second data metal layer DTL2 may include a second connection electrode CE2. The second connection electrode CE2 may be connected to the first connection electrode CE1 through a second contact hole (e.g., a second contact opening) CT2 penetrating the first insulating layer 161 and the first planarization layer 160. The second data metal layer DTL2 may be a single layer or a multilayer made of any one or more of, for example, molybdenum (Mo), aluminum (Al), chromium (Cr), gold (Au), titanium (Ti), nickel (Ni), neodymium (Ne), copper (Cu), and alloys of the same.

A second planarization layer 180 may be disposed on the second data metal layer DTL2. The second planarization layer 180 may be an organic layer, such as acryl resin, epoxy resin, phenolic resin, polyamide resin, or polyimide resin.

The third data metal layer DTL3 may be disposed on the second planarization layer 180. The third data metal layer DTL3 may include a third connection electrode CE3. The third connection electrode CE3 may be connected to the second connection electrode CE2 through a third contact hole (e.g., a third contact opening) CT3 penetrating the second insulating layer 181 and the second planarization layer 180. The third data metal layer DTL3 may be a single layer or a multilayer made of any one or more of, for example, molybdenum (Mo), aluminum (Al), chromium (Cr), gold (Au), titanium (Ti), nickel (Ni), neodymium (Ne), copper (Cu), and alloys of the same.

A third planarization layer 190 may be disposed on the third data metal layer DTL3. The third planarization layer 190 may be an organic layer, such as acryl resin, epoxy resin, phenolic resin, polyamide resin, or polyimide resin.

The fourth data metal layer DTL4 may be disposed on the third planarization layer 190. The fourth data metal layer DTL4 may include an anode pad electrode APD and a cathode pad electrode CPD. The anode pad electrode APD may be connected to the third connection electrode CE3 through a fourth contact hole (e.g., a fourth contact opening) CT4 penetrating the third insulating layer 191 and the third planarization layer 190. The cathode pad electrode CPD may be supplied with a first power supply voltage, which is a low potential voltage. The fourth data metal layer DTL4 may be a single layer or a multilayer made of any one or more of, for example, molybdenum (Mo), aluminum (Al), chromium (Cr), gold (Au), titanium (Ti), nickel (Ni), neodymium (Ne), copper (Cu), and alloys of the same.

A transparent conductive layer TCO for enhancing an adhesive strength to a first contact electrode CTE1 and a second contact electrode CTE2 of the light-emitting element LE may be disposed on each of the anode pad electrode APD and the cathode pad electrode CPD. The transparent conductive layer TCO may be formed of a transparent conductive oxide, such as indium tin oxide (ITO) and indium zinc oxide (IZO).

A protective layer PVX may be disposed on the anode pad electrode APD and the cathode pad electrode CPD. The protective layer PVX may be disposed to cover edges of the anode pad electrode APD and the cathode pad electrode CPD. The protective layer PVX may be an inorganic layer, such as, for example, a silicon nitride layer, a silicon oxynitride layer, a silicon oxide layer, a titanium oxide layer, or an aluminum oxide layer.

The light-emitting elements LE_B, LE_R, and LE_G may each be a flip chip-type micro LED in which the first contact electrode CTE1 and the second contact electrode CTE2 are disposed to face the anode pad electrode APD and the cathode pad electrode CPD.

Each of the light-emitting elements LE_B, LE_R, and LE_G may be an inorganic light-emitting element formed of an inorganic material, such as GaN. Each of the light-emitting elements LE_B, LE_R, and LE_G may have a length of a few to hundreds of micrometers (μm) in each of the first direction DR1, the second direction DR2, and the third direction DR3. For example, each of the light-emitting elements LE_B, LE_R, and LE_G may have a length of approximately 100 μm or less in each of the first direction DR1, the second direction DR2, and the third direction DR3.

The light-emitting elements LE_B, LE_R, and LE_G may include a first light-emitting element LE_B, a second light-emitting element LE_R, and a third light-emitting element LE_G. The first light-emitting element LE_B may be disposed in the first sub-pixel BP, the second light-emitting element LE_R may be disposed in the second sub-pixel RP, and the third light-emitting element LE_G may be disposed in the third sub-pixel GP.

The light-emitting elements LE_B, LE_R, and LE_G may each be formed by growing (e.g., may be grown) on a semiconductor substrate, such as a silicon wafer. Each of the light-emitting elements LE_B, LE_R, and LE_G may be directly transferred onto the anode pad electrode APD and the cathode pad electrode CPD of the substrate SUB from the silicon wafer. In another embodiment, each of the light-emitting elements LE_B, LE_R, and LE_G may be transferred onto the anode pad electrode APD and the cathode pad electrode CPD of the substrate SUB by using an electrostatic method using an electrostatic head or a stamp method and an elastic high molecular-weight substance, such as polydimethylsiloxane (PDMS), silicon, or the like, as a transfer substrate.

Each of the light-emitting elements LE_B, LE_R, and LE_G may be a light emitting structure including a base substrate SSUB, an n-type semiconductor NSEM, an active layer MQW, a p-type semiconductor PSEM, the first contact electrode CTE1, and the second contact electrode CTE2.

The base substrate SSUB may be a sapphire substrate, but embodiments of the present disclosure are not limited thereto.

The n-type semiconductor NSEM may be disposed on one surface of the base substrate SSUB. For example, the n-type semiconductor NSEM may be disposed on a lower surface of the base substrate SSUB. The n-type semiconductor NSEM may be made of GaN doped with an n-type conductive dopant, such as Si, Ge, Sn, or the like.

The active layer MQW may be disposed on a portion of a first surface of the n-type semiconductor NSEM. The active layer MQW may include a material having a single or multiple quantum well structure. When the active layer MQW includes a material having a multiple quantum well structure, the active layer MQW may have a structure in which a plurality of well layers and barrier layers are alternately stacked. In such an embodiment, the well layer may be formed of InGaN and the barrier layer may be formed of GaN or AlGaN, but the present disclosure is not limited thereto. In some embodiments, the active layer MQW may have a structure in which semiconductor materials having large band gap energy and semiconductor materials having small band gap energy are alternately stacked, and the active layer MQW may include other suitable Group III to V semiconductor materials depending on the wavelength band of the emitted light.

The p-type semiconductor PSEM may be disposed on one surface of the active layer MQW. The p-type semiconductor PSEM may be made of GaN doped with a p-type conductive dopant, such as Mg, Zn, Ca, Se, Ba, or the like.

The first contact electrode CTE1 may be disposed on the p-type semiconductor PSEM, and the second contact electrode CTE2 may be disposed on another portion of the first surface of the n-type semiconductor NSEM. The portion of the first surface of the n-type semiconductor NSEM on which the second contact electrode CTE2 is disposed may be spaced apart from the portion of the first surface of the n-type semiconductor NSEM on which the active layer MQW is disposed.

The first contact electrode CTE1 and the anode pad electrode APD may be attached to each other through a conductive adhesive member, such as an anisotropic conductive film (ACF) or an anisotropic conductive paste (ACP). In some embodiments, the first contact electrode CTE1 and the anode pad electrode APD may be attached to each other through a soldering process.

The light-emitting elements LE_B, LE_R, and LE_G disposed on the respective sub-pixels BP, RP, and GP may be arranged in the first direction DR1.

The light-emitting elements LE_B, LE_R, and LE_G may emit the first light, the second light, and the third light, respectively. Each of the light-emitting elements LE_B, LE_R, and LE_G may emit the light in all directions including the third direction DR3 (e.g., a forward direction), a direction opposite to the third direction (e.g., a rearward direction), the first direction DR1, a direction opposite to the first direction DR1, the second direction DR2, and a direction opposite to the second direction DR2 as shown in FIG. 4.

Further, the light-emitting element layer EML may further include the viewing angle control portion MLP disposed on each of the light-emitting elements LE_B, LE_R, and LE_G, the reflecting portion WRP, and a light-transmitting portion TMP. The viewing angle control portion MLP and the reflecting portion WRP may adjust (e.g., may be configured to adjust) the vertical viewing angles of the light-emitting elements LE_B, LE_R, and LE_G as described above. For example, in one embodiment, the viewing angle control portion MLP disposed on each of the light-emitting elements LE_B, LE_R, and LE_G may adjust the vertical viewing angle of light emitted in the third direction DR3 (e.g., the forward direction) from among the light emitted from the light-emitting elements LE_B, LE_R, and LE_G, and the reflecting portion WRP may adjust the vertical viewing angles of light emitted in the second direction DR2 and the direction opposite to the second direction DR2 from among the light emitted from the light-emitting elements LE_B, LE_R, and LE_G.

The reflecting portion WRP may be provided in plural. A plurality of reflecting portions WRP may be disposed on one side in the second direction DR2 of the light-emitting elements LE_B, LE_R, and LE_G and on the other side in the second direction DR2 of the light-emitting elements LE_B, LE_R, and LE_G in a plan view. The reflecting portion WRP disposed on the other side in the second direction DR2 of the light-emitting elements LE_B, LE_R, and LE_G may be disposed between the light-emitting elements LE_B, LE_R, and LE_G of one pixel PX and light-emitting elements LE_B, LE_R, and LE_G in another pixel PX adjacent to the pixel PX in the direction opposite to the second direction DR2.

The reflecting portion WRP may have a shape extending along the first direction DR1. For convenience of description, the light-emitting elements LE_B, LE_R, and LE_G of one pixel PX and the reflecting portions WRP adjacent to the light-emitting elements LE_B, LE_R, and LE_G of the pixel PX are described. The reflecting portions WRP adjacent to the light-emitting elements LE_B, LE_R, and LE_G of the pixel PX may be in contact with one end in the second direction DR2 of the light-emitting elements LE_B, LE_R, and LE_G and the other end in the second direction DR2 of the light-emitting elements LE_B, LE_R, and LE_G. The reflecting portions WRP may include a white-color-based resin. The reflecting portions WRP may include a base resin and white-color-based pigments or dyes dispersed in the base resin. The reflecting portions WRP may include a white-color-based resin and may be disposed to be in direct contact with one end in the second direction DR1 of the light-emitting elements LE_B, LE_R, and LE_G and the other end in the second direction DR2, thereby reflecting (e.g., directly reflecting) the light emitted in the second direction DR2 and the direction opposite to the second direction DR2 from the light-emitting elements LE_B, LE_R, and LE_G back toward the light-emitting elements LE_B, LE_R, and LE_G. For example, the reflecting portions WRP reflect (e.g., directly reflect) the light emitted in the second direction DR2 and the direction opposite to the second direction DR2 from the light-emitting elements LE_B, LE_R, and LE_G back toward the light-emitting elements LE_B, LE_R, and LE_G so that the light emitted in the second direction DR2 and the direction opposite to the second direction DR2 from each of the light-emitting elements LE_B, LE_R, and LE_G can be recycled (or reflected) and provided to one side (e.g., a front surface) in the third direction DR3 or to one side (or the other side) in the first direction DR1. For example, from among the recycled light, the light provided to one side (e.g., a front surface) in the third direction DR3 may have their vertical viewing angles adjusted by the viewing angle control portions MLP The reflecting portions WRP may have a reflectance (e.g., a predetermined reflectance) to recycle the light emitted in the second direction DR2 and the direction opposite to the second direction DR2 from each of the light-emitting elements LE_B, LE_R, and LE_G by reflecting (e.g., directly reflecting) the light emitted in the second direction DR2 and the direction opposite to the second direction DR2 from the light-emitting elements LE_B, LE_R, and LE_G back to the light-emitting elements LE_B, LE_R, and LE_G. In one embodiment, a reflectance of the white-color-based resin included in the reflecting portions WRP may be, for example, 80% and, in some embodiments, 90% or more, but is not limited thereto. As shown in FIG. 6, the reflecting portion WRP may be directly disposed on the protective layer PVX and the transparent conductive layer TCO exposed by the protective layer PVX.

The light-transmitting portion TMP may be disposed in a space between a pair of adjacent light-emitting elements LE_B, LE_R, and LE_G. The light-transmitting portions TMP may be in direct contact with side surfaces of the adjacent light-emitting elements LE_B, LE_R, and LE_G. For example, the light-transmitting portions TMP may be in direct contact with side surface in the first direction and side surfaces in the direction opposite to the first direction DR1 of the adjacent light-emitting elements LE_B, LE_R, and LE_G. Further, the light-transmitting portions TMP may be disposed to be in contact with side surfaces in the second direction DR2 of the reflecting portions WRP. The light-transmitting portions TMP, according to an embodiment, may transmit the light emitted in the first direction DR1 and the direction opposite to the first direction DR1 from each of the light-emitting elements LE_B, LE_R, and LE_G. The light-transmitting portions TMP, according to an embodiment, transmit the light emitted in the first direction DR1 and the direction opposite to the first direction DR1 from each of the light-emitting elements LE_B, LE_R, and LE_G, thereby allowing the widest possible angular range for the horizontal viewing angle (e.g., the widest possible horizontal viewing angle). The light-transmitting portions TMP, according to an embodiment, may include transparent resin to transmit the light emitted in the first direction DR1 and the direction opposite to the first direction DR1 from each of the light-emitting elements LE_B, LE_R, and LE_G. The light transmittance of the transparent resin may be 90% or more, and in some embodiments, 95% or more, but is not limited thereto. As shown in FIG. 6, the light-transmitting portion TMP may be directly disposed on the protective layer PVX and the transparent conductive layer TCO exposed by the protective layer PVX.

The viewing angle control portion MLP may be disposed on each of the light-emitting elements LE_B, LE_R, and LE_G. The viewing angle control portion MLP may be provided in plural, and the plurality of viewing angle control portions MLP may be disposed on the light-emitting elements LE_B, LE_R, and LE_G, respectively. The plurality of viewing angle control portions MLP disposed on the respective light-emitting elements LE_B, LE_R, and LE_G may be disposed apart from (e.g., may be spaced apart from) one another. Each of the viewing angle control portions MLP may have a planar size substantially the same as the planar size of the overlapping light-emitting element LE_B, LE_R, LE_G, but they are not limited thereto. The viewing angle control portion MLP may adjust a light path of the light emitted in the third direction DR3 from each of the light-emitting elements LE_B, LE_R, LE_G, thereby adjusting the vertical viewing angle of the display device 100 (e.g., by reducing the vertical viewing angle to an angular range) as described above.

As shown in FIGS. 5 and 6, lower surfaces of the viewing angle control portions MLP may be in direct contact with upper surfaces of the light-emitting elements LE_B, LE_R, LE_G, and side surfaces of the viewing angle control portions MLP may be in direct contact with the reflecting portions WRP and/or the light-transmitting portions TMP.

As shown in FIG. 7, the viewing angle control portion MLP may include a plurality of layers L1 and L2 which have different refractive indices from each other to reduce the vertical viewing angle of the display device 100 e (e.g., to the predetermined angular range) by adjusting the light emitted in the third direction DR3 from each of the light-emitting elements LE_B, LE_R, LE_G. In FIG. 7, two layers L1 and L2 having different refractive indices from each other are illustrated, but the present disclosure is not limited thereto. For example, three or more layers having different refractive indices may be provided. Hereinafter, for convenience of description, an embodiment in which the viewing angle control portion MLP includes two layers having different refractive indices from each other will be described. The viewing angle control portion MLP may include a first layer L1 and a second layer L2 on the first layer L1. Each of the first and second layers L1 and L2 may be provided in plural. For example, the viewing angle control portion MLP may include a plurality of first layers L1 and a plurality of second layers L2. The plurality of first layers L1 and the plurality of second layers L2 may be alternately stacked along the thickness direction. For example, the number of layers in a stack of the first layers L1 and the second layers L2 may be three or more, and in some embodiments, five or more, but is not limited thereto.

For example, one first layer L1 may be directly disposed on the base substrate SSUB, one second layer L2 may be directly disposed on the first layer L1, and another first layer L1 may be directly disposed on the second layer L2. In one embodiment, the refractive index of the first layer L1 may be greater than the refractive index of the second layer L2. For example, a difference in refractive index between adjacent layers (e.g., adjacent first and second layers L1 and L2) may be approximately 0.3 or more. When the difference in refractive index between the adjacent first and second layers L1 and L2 is approximately 0.3 or more, the vertical viewing angle of the display device 100 may be easily reduced (e.g., reduced to the predetermined angular range) by adjusting the light paths of the light emitted in the third direction DR3 from each of the light-emitting elements LE_B, LE_R, and LE_G. The first layer L1 and the second layer L2 may each include, but is not limited to, an inorganic material. The first layer L1 may include titanium oxide (e.g., TiO$_2$), and the second layer L2 may include silicon oxide (e.g., SiO$_2$). In some embodiments, the first layer L1 and the second layer L2 may each include an organic material, or one of the first layer L1 and the second layer L2 may include an inorganic material while the other layer may include an organic material.

The thickness TMLP of the viewing angle control portion MLP may be the sum of the thicknesses T1 of the stacked first layers L1 and the sum of the thicknesses T2 of the stacked second layers L2. The thickness T1 of the first layer L1 and the thickness T2 of the second layer L2 may be the same as each other or may be different from each other.

In one embodiment, the thickness TMLP of the viewing angle control portion MLP on the first light-emitting element LE_B, the thickness TMLP of the viewing angle control portion MLP on the second light-emitting element LE_R, and the thickness TMLP of the viewing angle control portion MLP on the third light-emitting element LE_G may be the same as one another. For example, the thickness TMLP of the viewing angle control portion MLP may be in a range of about 10 nm to about 900 nm but is not limited thereto.

Figure 8:
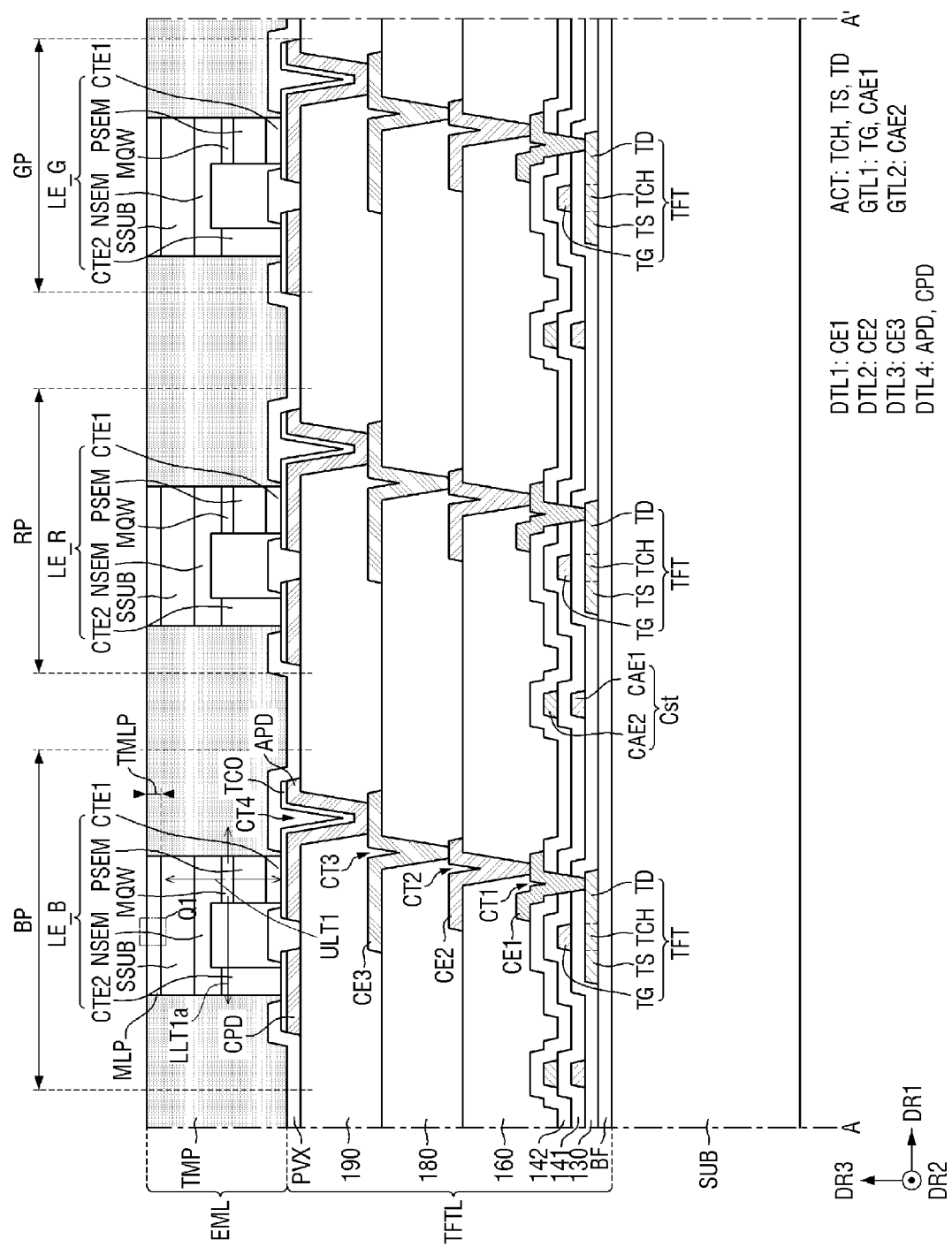
FIGS. 8 and 9 are schematic views respectively showing functions of a light-transmitting portion and a reflecting portion of a light-emitting element layer according to an embodiment.
Figure 9:
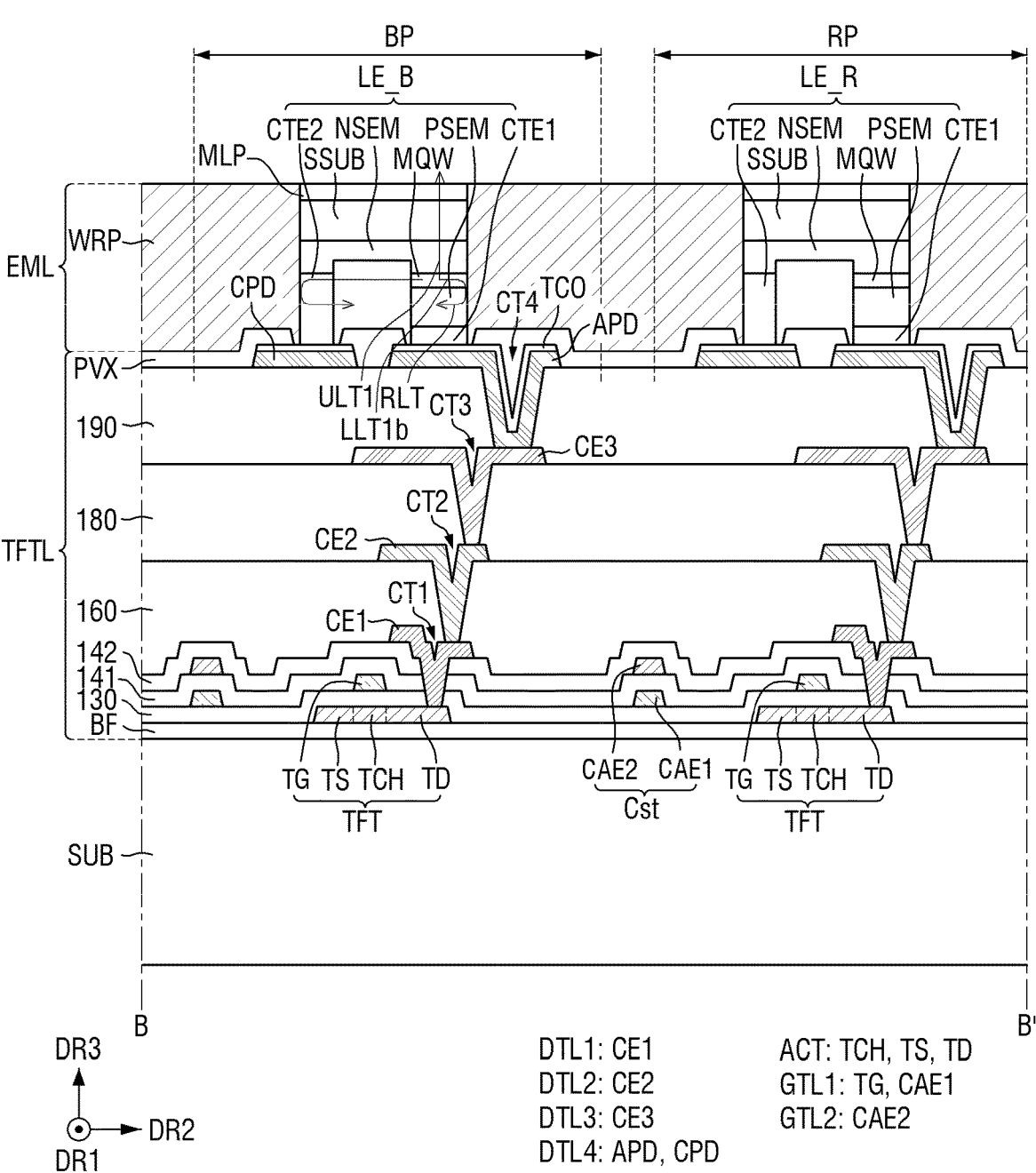
Figure 10:
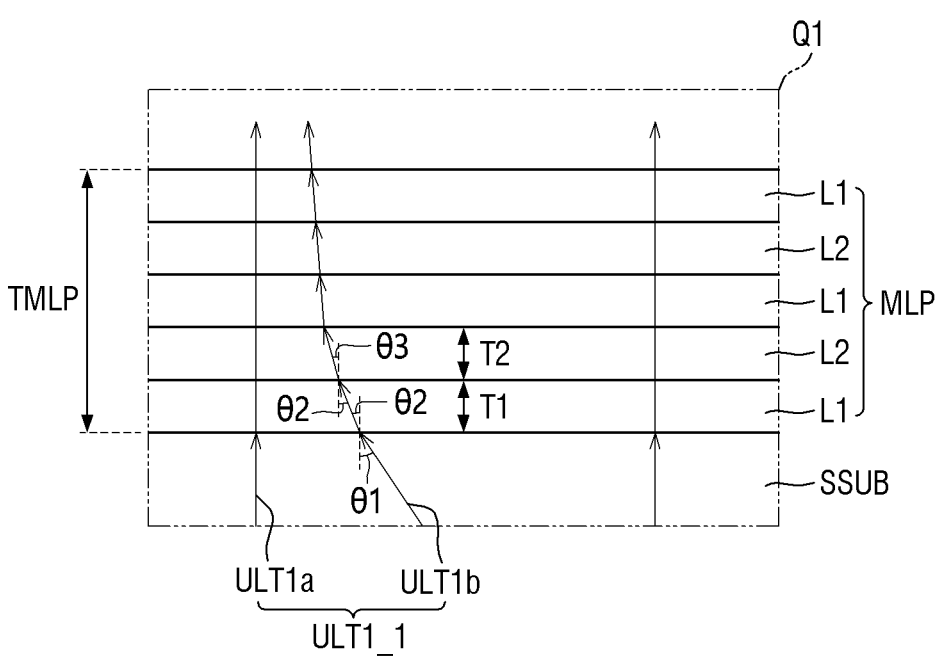
FIG. 10 is a schematic diagram showing a function of a viewing angle control portion of a light-emitting element layer according to an embodiment.

FIGS. 8 and 9 are schematic views respectively showing functions of a light-transmitting portion and a reflecting portion of a light-emitting element layer according to an embodiment. FIG. 10 is a schematic diagram showing a function of a viewing angle control portion of a light-emitting element layer according to an embodiment.

Referring to FIG. 8, as described above, each of the light-emitting elements LE_B, LE_R, and LE_G may emit the light in all directions including the third direction DR3 (e.g., the forward direction), a direction opposite to the third direction (e.g., a rearward direction), the first direction DR1, a direction opposite to the first direction DR1, the second direction DR2, and a direction opposite to the second direction DR2. Hereinafter, for convenience of description, the light emitted in the third direction DR3 will be referred to as an upper light ULT1, the light emitted in the first direction DR1 and the direction opposite to the first direction DR1 will be referred to as first lateral light LLT1$a$, and the light emitted in the second direction DR2 and the direction opposite to the second direction DR2 will be referred to as second lateral light LLT1$b$.

As shown in FIG. 8, because the light-transmitting portions TMP transmit the light emitted in the first direction DR1 and the direction opposite to the first direction DR1 from each of the light-emitting elements LE_B, LE_R, and LE_G, the first lateral light LLT1$a$ are respectively transmitted in the first direction DR1 and the direction opposite to the first direction DR1, thereby allowing the widest possible angular range for the horizontal viewing angle, as described above.

As shown in FIG. 9, the reflecting portions WRP include a white-color-based resin and are disposed to be in direct contact with one end and the other end in the second direction DR2 of the light-emitting elements LE_B, LE_R, and LE_G to reflect the light (e.g., the second lateral light LLT1$b$) emitted in the second direction DR2 and the direction opposite to the second direction DR2 from each of the light-emitting elements LE_B, LE_R, and LE_G back to (or toward) the light-emitting elements LE_B, LE_R, and LE_G (see, e.g., RLT). Accordingly, as described above, the second lateral light LLT1$b$ may be recycled and provided to one side (or front surface) in the third direction DR3 or to one side (or the other side) in the first direction DR1, and the vertical viewing angle may be adjusted by the viewing angle control portion MLP as described above.

As shown in FIG. 10, the upper light ULT1 may include a first upper light ULT1$a$ having a vertical viewing angle less than or equal to a range (e.g., a predetermined range) and a second upper light ULT1$b$ having a vertical viewing angle greater than the range. The viewing angle control portion MLP, according to an embodiment, may change (or vary) the light path of the second upper light ULT1$b$ having a vertical viewing angle greater than the range, thereby controlling (or modifying) the second upper light ULT1$b$ passing through the viewing angle control portion MLP to have a vertical viewing angle less than or equal to the range. For example, the second upper light ULT1$b$ is incident from the base substrate SSUB to the first layer L1 at a first angle 81 and is refracted at a second angle 82 due to a difference in refractive index between the base substrate SSUB and the first layer L1. The refractive index of the base substrate SSUB may be smaller than that of the first layer L1. The second angle 82 may be smaller than the first angle 81. Then, the second upper light ULT1$b$ refracted at the second angle 82 is incident from the first layer L1 to the second layer L2 at the second angle 82, and then refracted at a third angle 83 due to a difference in refractive index between the first layer L1 and the second layer L2. Then, at a boundary between the repeatedly stacked second layer L2 and the first layer L1, the second upper light ULT1$b$ passing through the viewing angle control portion MLP while being repeatedly refracted may have a vertical viewing angle less than or equal to the range.

Hereinafter, functions of the viewing angle control portion MLP, the reflecting portion WRP, and the light-transmitting portion TMP applied to the present embodiment will be described in more detail with reference to FIGS. 11 to 14.

Figure 11:
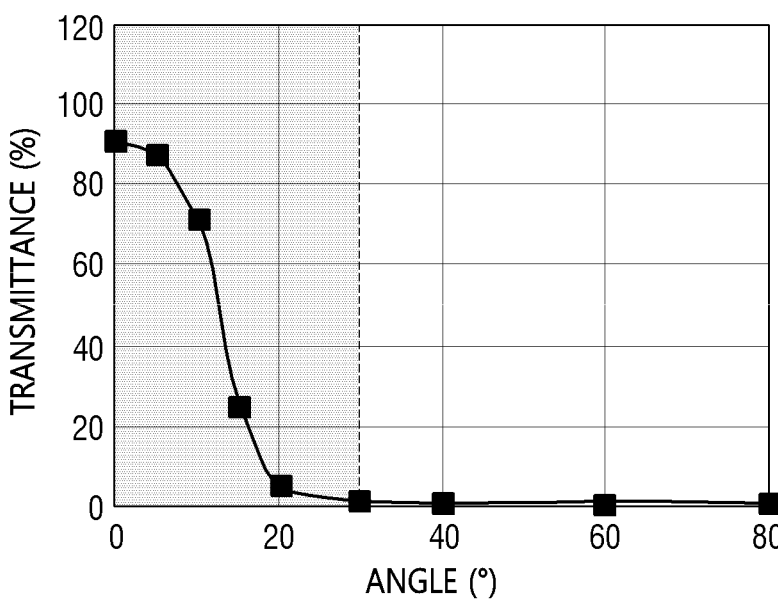
FIG. 11 is a graph showing the transmittance according to an angle when a viewing angle control portion according to an embodiment is applied.
Figure 12:
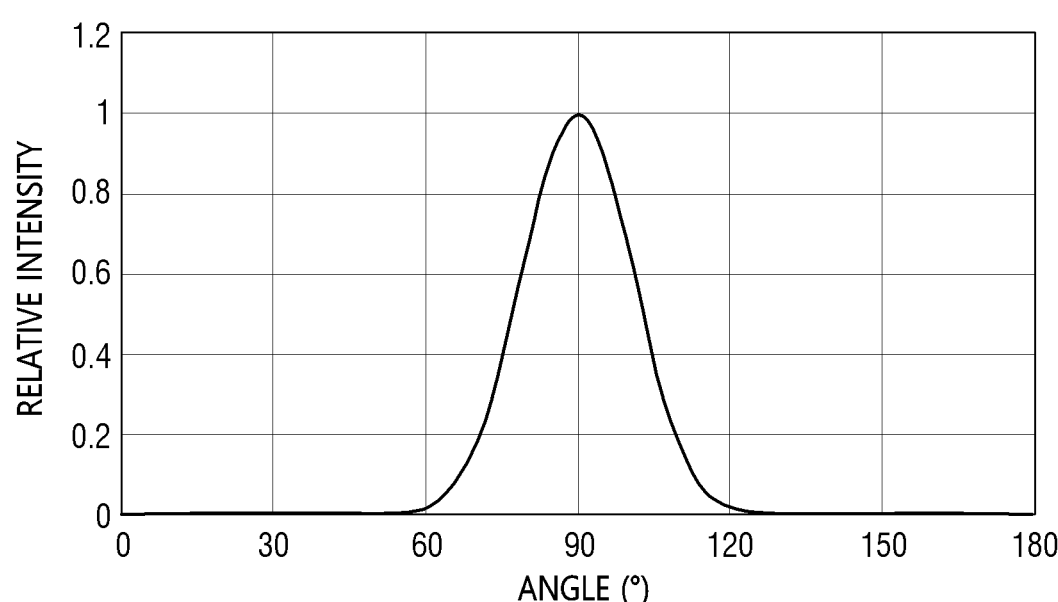
FIG. 12 is a graph showing the relative intensity of light according to an angle when a viewing angle control portion according to an embodiment is applied.
Figure 13:
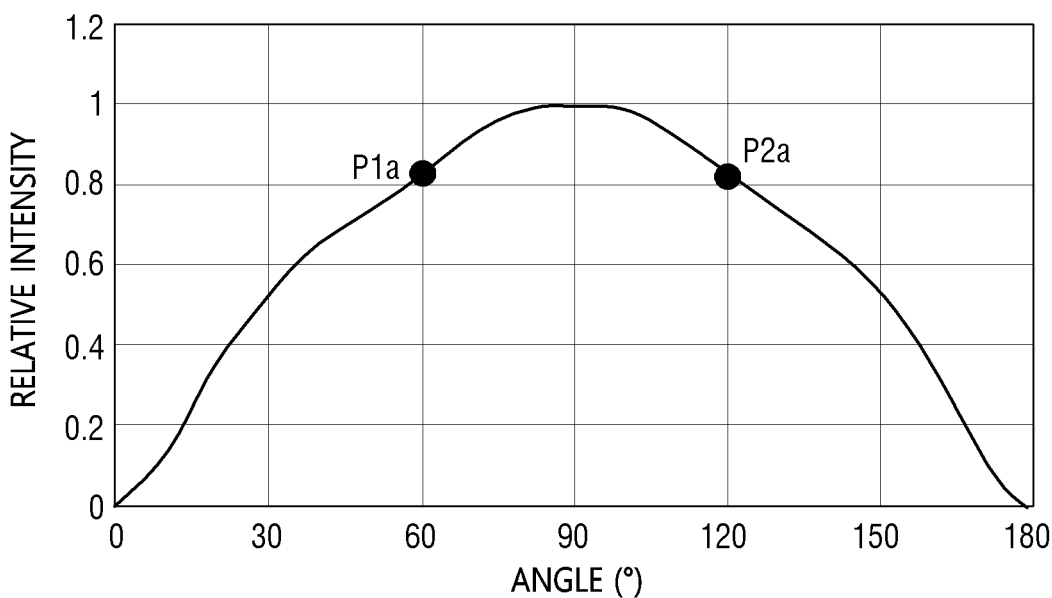
FIG. 13 is a graph showing the relative intensity of light according to an angle when a light-transmitting portion according to an embodiment is applied.

FIG. 11 is a graph showing the transmittance according to an angle when a viewing angle control portion according to an embodiment is applied. FIG. 12 is a graph showing the relative intensity of light according to an angle when a viewing angle control portion according to an embodiment is applied. FIG. 13 is a graph showing the relative intensity of light according to an angle when a light-transmitting portion according to an embodiment is applied. FIG. 14 is a graph showing the relative intensity of light according to an angle when a reflecting portion according to an embodiment is applied.

FIG. 11 shows the transmittance (%) (or light transmittance) according to an angle (°) when only the viewing angle control portion MLP disposed on each of the light-emitting elements LE_B, LE_R, and LE_G is applied to the light-emitting element EML shown in FIG. 4 and the reflecting portion WRP and the light-transmitting portion TMP are not applied. In FIG. 11, the angle relates to an angle between a plane perpendicular to an upper surface of the viewing angle control portion MLP and the light transmitted through the viewing angle control portion MLP. FIG. 12 shows the relative intensity of light according to an angle (°) when only the viewing angle control portion MLP disposed on each of the light-emitting elements LE_B, LE_R, and LE_G is applied to the light-emitting element EML shown in FIG. 4 and the reflecting portion WRP and the light-transmitting portion TMP are not applied. In FIG. 12, the angle relates to an angle between the upper surface of the viewing angle control portion MLP (or the third direction DR3) and the light transmitted through the viewing angle control portion MLP.

FIG. 13 shows the relative intensity of light according to an angle (°) when the viewing angle control portion MLP, the reflecting portion WRP, and the light-transmitting portion TMP are all applied to the light-emitting element EML shown in FIG. 4. In FIG. 13, the angle relates to an angle (or horizontal viewing angle) between the first direction DR1 and the light transmitted through the light-transmitting portion TMP.

FIG. 14 shows the relative intensity of light according to an angle (°) when the viewing angle control portion MLP, the reflecting portion WRP, and the light-transmitting portion TMP are all applied to the light-emitting element EML shown in FIG. 4. In FIG. 14, the angle relates to an angle between the upper surface of the viewing angle control portion MLP (or the third direction DR3) and the light transmitted through the viewing angle control portion MLP.

First, as shown in FIG. 11, when only the viewing angle control portion MLP disposed on each of the light-emitting elements LE_B, LE_R, and LE_G is applied to the light-emitting element layer EML and the reflecting portion WRP and the light-transmitting portion TMP are omitted, most of the light has an angle (e.g., an angle of incidence) of 30° or less passes through the viewing angle control portion MLP. For example, approximately 90% or more of light passing through the viewing angle control portion MLP may be light having an angle of 30° or less but is not limited thereto.

As shown in FIG. 12, when only the viewing angle control portion MLP disposed on each of the light-emitting elements LE_B, LE_R, and LE_G is applied to the light-emitting element layer EML and the reflecting portion WRP and the light-transmitting portion TMP are omitted, most of light having an angle of 60° to 130° passes through the viewing angle control portion MLP.

As shown in FIGS. 11 and 12, even when only the viewing angle control portion MLP disposed on each of the light-emitting elements LE_B, LE_R, and LE_G is applied to the light-emitting element layer EML, the viewing angle control portion MLP effectively controls the vertical viewing angle of the light emitted from each of the light-emitting elements LE_B, LE_R, and LE_G to be within a desired (or predetermined) range.

As shown in FIG. 13, when the viewing angle control portion MLP, the reflecting portion WRP, and the light-transmitting portion TMP are all applied to the light-emitting element EML shown in FIG. 4, a wider horizontal viewing angle is achieved. For example, the relative intensities (or relative intensity of light) P1*a* and P2*a* at viewing angles of 60° and 120° are approximately 0.8 or more, respectively.

On the contrary, as shown in FIG. 14, when the viewing angle control portion MLP, the reflecting portion WRP, and the light-transmitting portion TMP are all applied to the light-emitting element EML shown in FIG. 4, the vertical viewing angle is within the desired range. For example, the relative intensities (or relative intensity of light) P1*b* and P2*b* at viewing angles of 60° and 120° are approximately 0.4 or less, respectively.

Hereinafter, a method of fabricating a display device according to an embodiment will be described.

FIG. 15 is a flowchart of a method of fabricating a display device according to an embodiment. FIGS. 16 to 20 and 23 are perspective views showing processing steps of a method of fabricating a display device according to an embodiment. FIGS. 21 and 22 are cross-sectional views showing processing steps of a method of fabricating a display device according to an embodiment.

The method of fabricating a display device will be described with reference to FIGS. 15 to 23 in conjunction with FIGS. 4 to 7, described above.

A method of fabricating a display device according to an embodiment may include disposing a light-emitting element layer EML on a substrate SUB, which includes a plurality of pixels PX. The method may further include forming a thin film transistor layer TFTL on the substrate SUB which includes the plurality of pixels PX before disposing the light-emitting element layer EML.

The disposing of the light-emitting element layer EML may include disposing light-emitting elements LE_B, LE_R, and LE_G and viewing angle control portions MLP, the light-emitting elements being disposed in each pixel PX and configured to emit light and the viewing angle control portions being respectively disposed on the light-emitting elements LE_B, LE_R, and LE_G. The light-emitting elements LE_B, LE_R, and LE_G and the viewing angle control portions MLP may be fabricated together during the process of disposing the light-emitting elements LE_B, LE_R, and LE_G, which are disposed in each pixel PX and configured to emit light, and the viewing angle control portions MLP which are respectively disposed on the light-emitting elements LE_B, LE_R, and LE_G. This will be described with reference to FIGS. 16 to 20.

Figure 16:
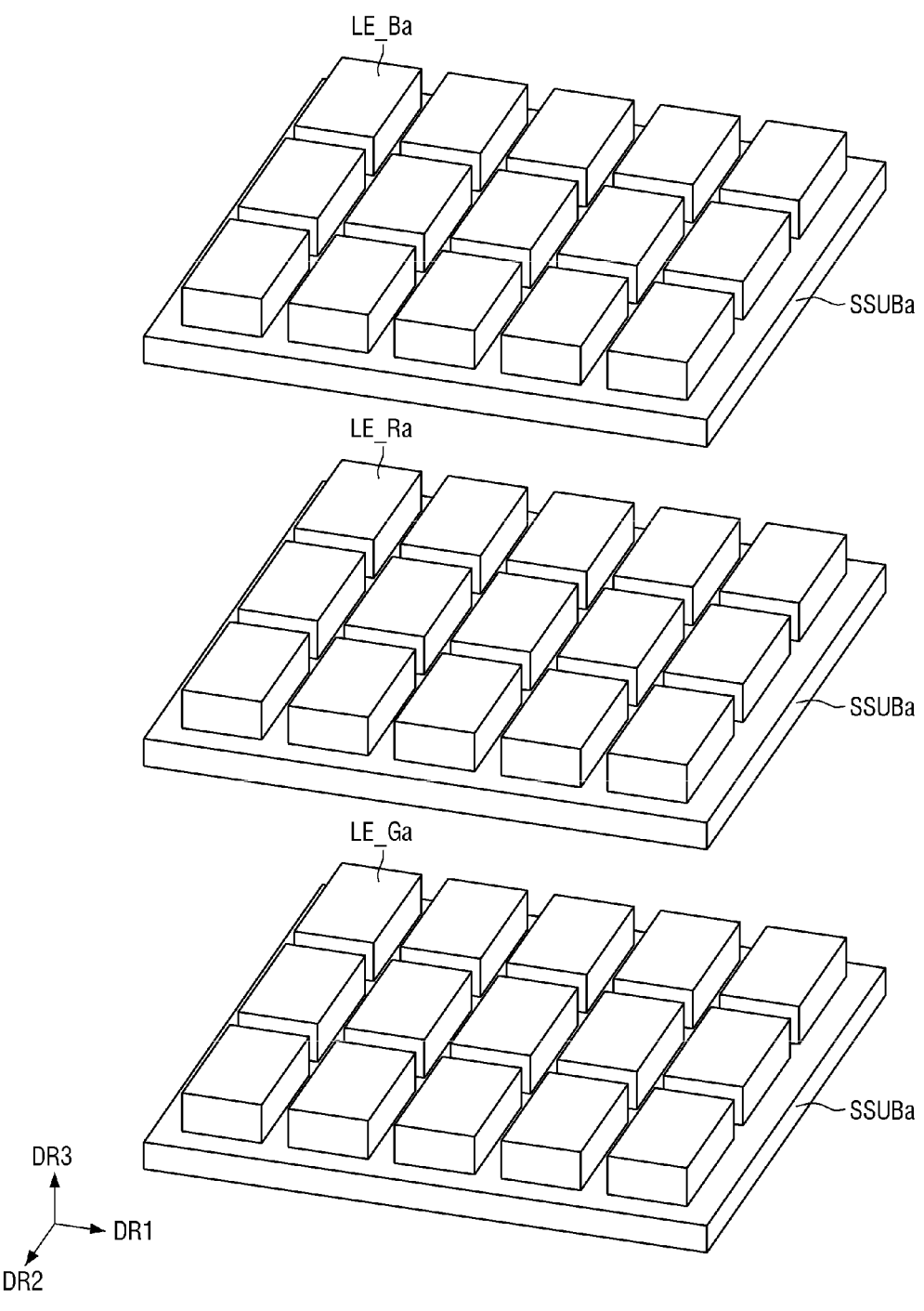

First, as shown in FIG. 16, a plurality of base substrates SSUBa are prepared. A plurality of light-emitting elements LE_Ba, LE_Ra, and LE_Ga is formed on one surface of each base substrate SSUBa. The structure of each of the formed light-emitting elements LE_Ba, LE_Ra, and LE_Ga may include the n-type semiconductor NSEM, the active layer MQW, the p-type semiconductor PSEM, the first contact electrode CTE1, and the second contact electrode CTE2 as described above with reference to FIG. 5. In FIG. 16, the plurality of light-emitting elements LE_Ba, LE_Ra, and LE_Ga formed on each base substrate SSUBa are illustrated as being separate from one another, but the present disclosure is not limited thereto. For example, the plurality of light-emitting elements LE_Ba, LE_Ra, and LE_Ga formed on each base substrate SSUBa may be connected to each other and may then be separated from each other through a cutting process, which will be described below with reference to FIG. 19.

Figure 17:
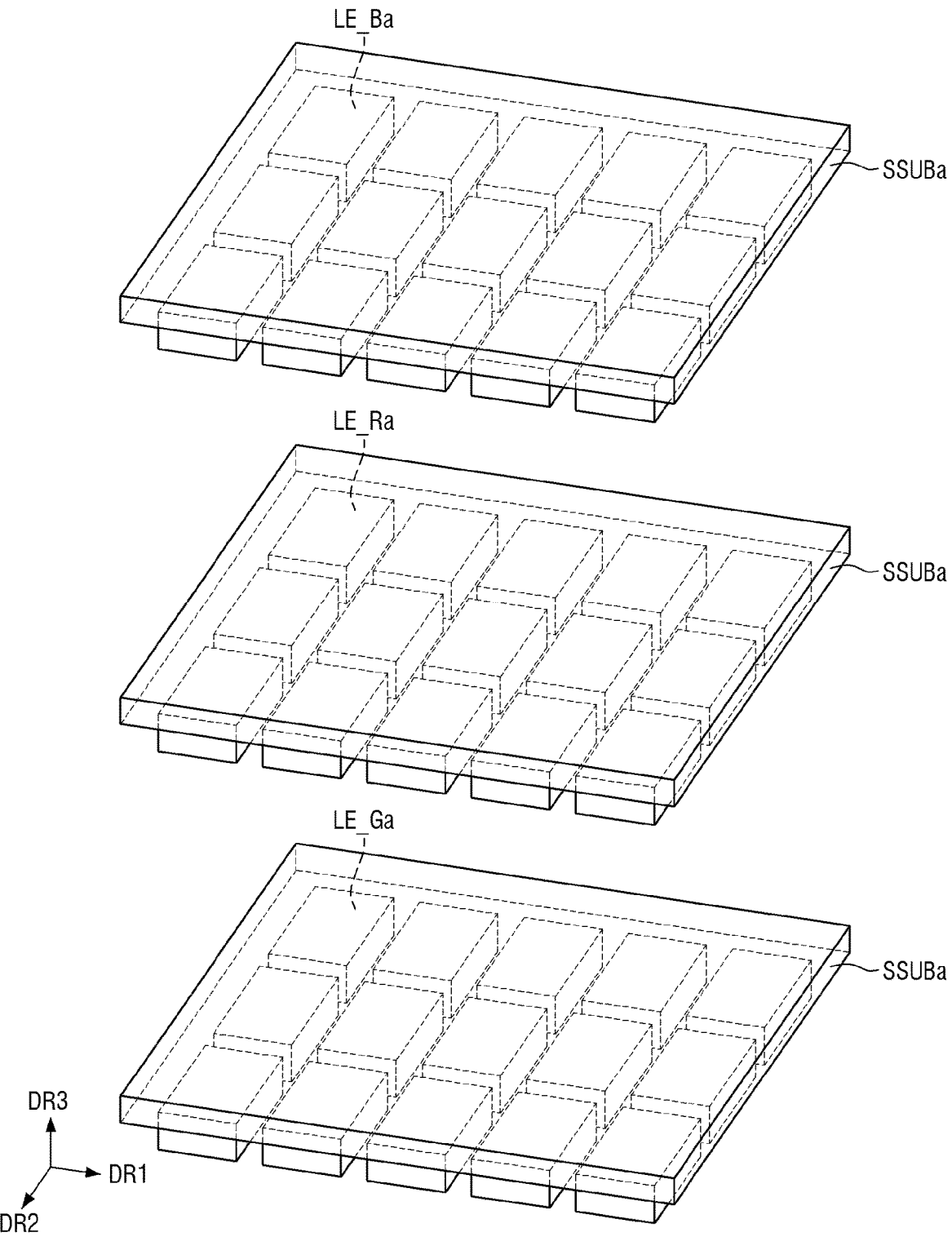

Then, as shown in FIG. 17, each base substrate SSUBa and the plurality of light-emitting elements LE_Ba, LE_Ra, and LE_Ga on each base substrate SSUBa are flipped.

Figure 18:
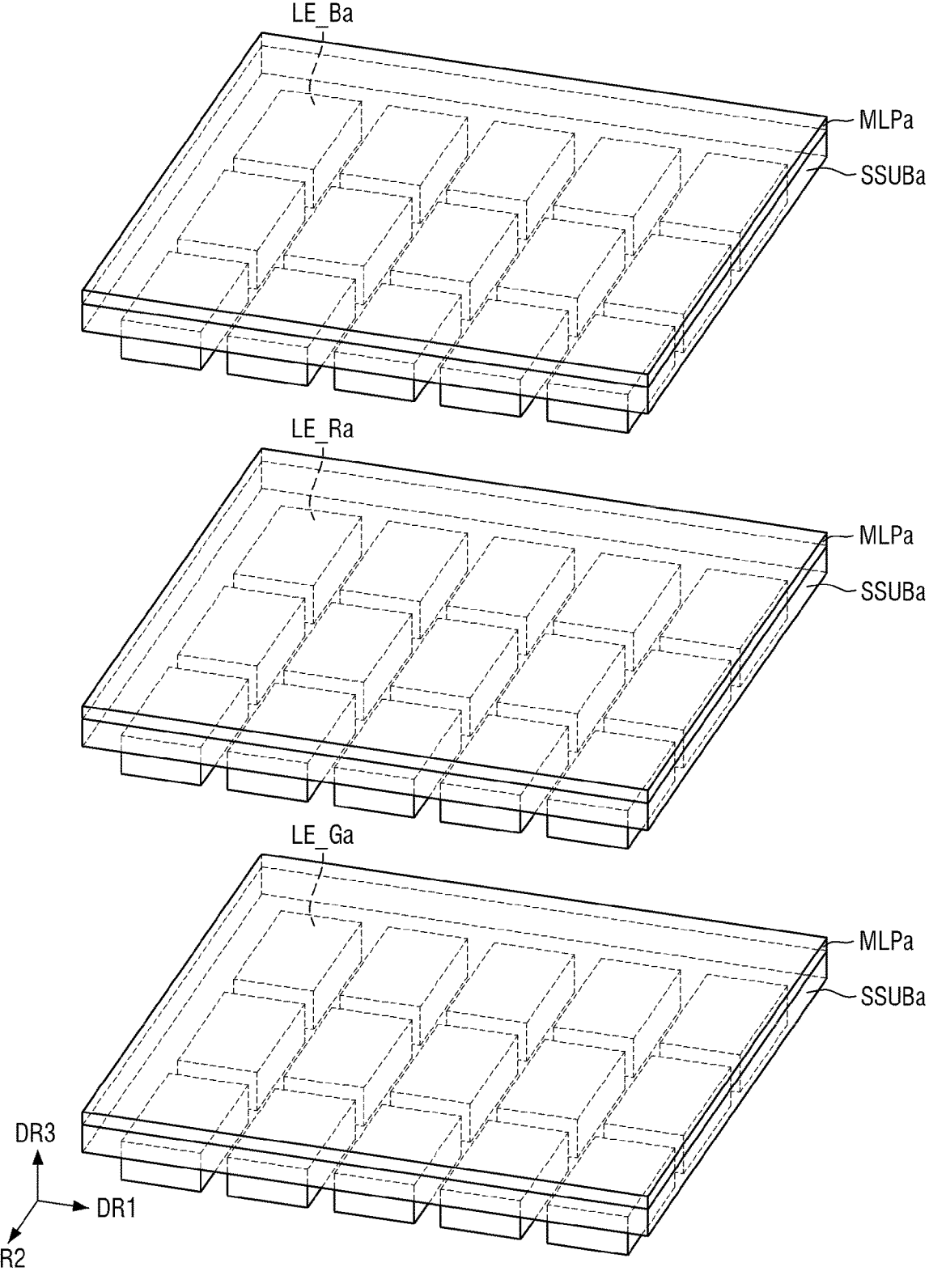

Thereafter, as shown in FIG. 18, a viewing angle control portion MLPa is formed on the other surface of each base substrate SSUBa. The detailed structure of the viewing angle control portion MLPa formed on the other surface of each base substrate SSUBa has been described in detail above with reference to FIG. 10 and, thus, will not be described.

Figure 19:
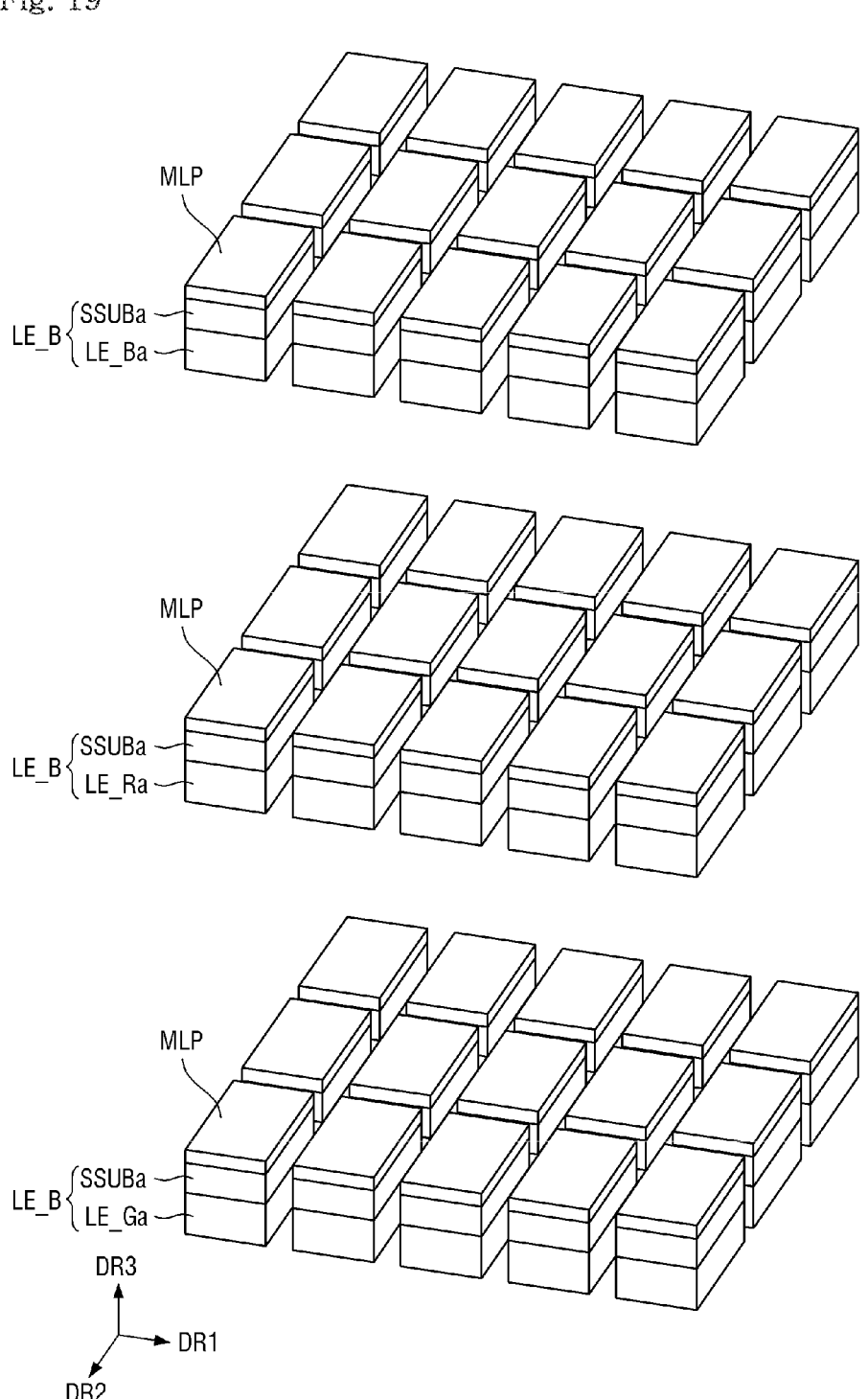

Then, as shown in FIG. 19, each of the base substrates SSUBa, the plurality of light-emitting elements LE_Ba, LE_Ra, and LE_Ga, and the viewing angle control portion MLPa are separated (e.g., are cut). Accordingly, each of the light-emitting elements LE_B, LE_R, and LE_G and the viewing angle control portions MLP on the respective light-emitting elements LE_B, LE_R, and LE_G may be fabricated.

Figure 20:
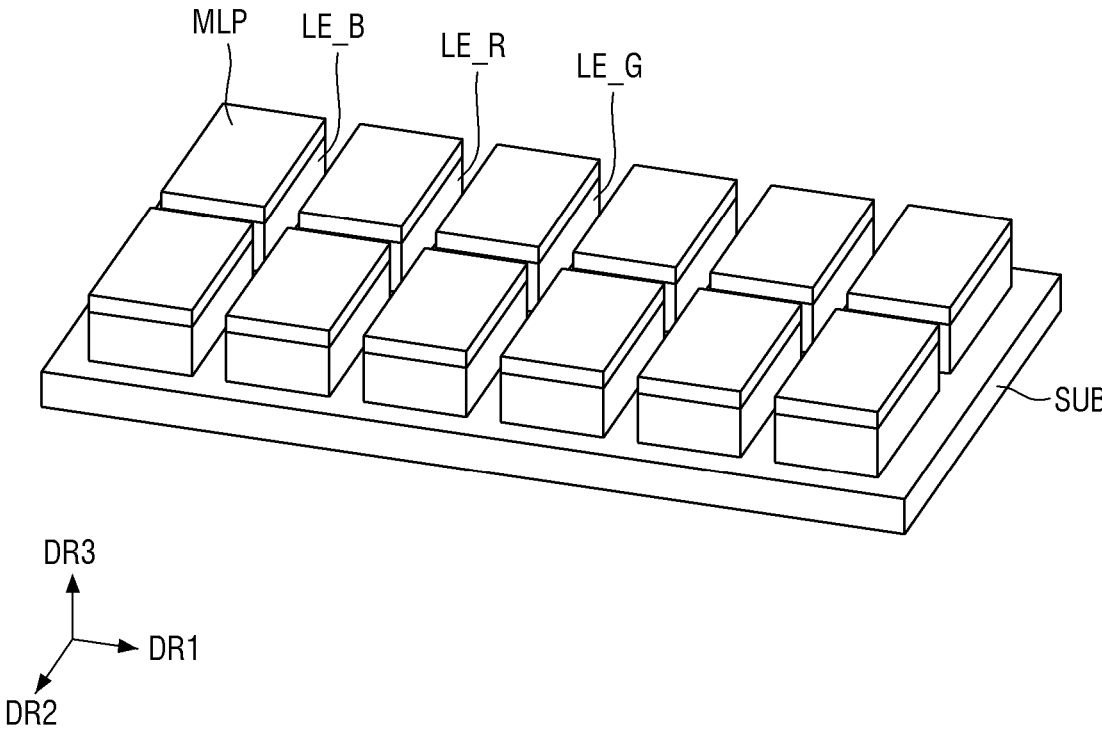

Then, as shown in FIGS. 20 to 22, the light-emitting elements LE_B, LE_R, and LE_G and the viewing angle control portions MLP on the respective light-emitting elements LE_B, LE_R, and LE_G are disposed on a substrate SUB including a plurality of pixels PX. As described above with reference to FIG. 4, in FIG. 20, for convenience of illustration, the light-emitting elements LE_B, LE_R, and LE_G are illustrated as being directly disposed on the substrate SUB. However, in practice, a thin film transistor layer TFTL may be further disposed between the substrate SUB and the light-emitting elements LE_B, LE_R, and LE_G, as shown in FIGS. 21 and 22. The light-emitting elements LE_B, LE_R, and LE_G may be arranged in the first direction DR1 but are not limited thereto.

Figure 23:
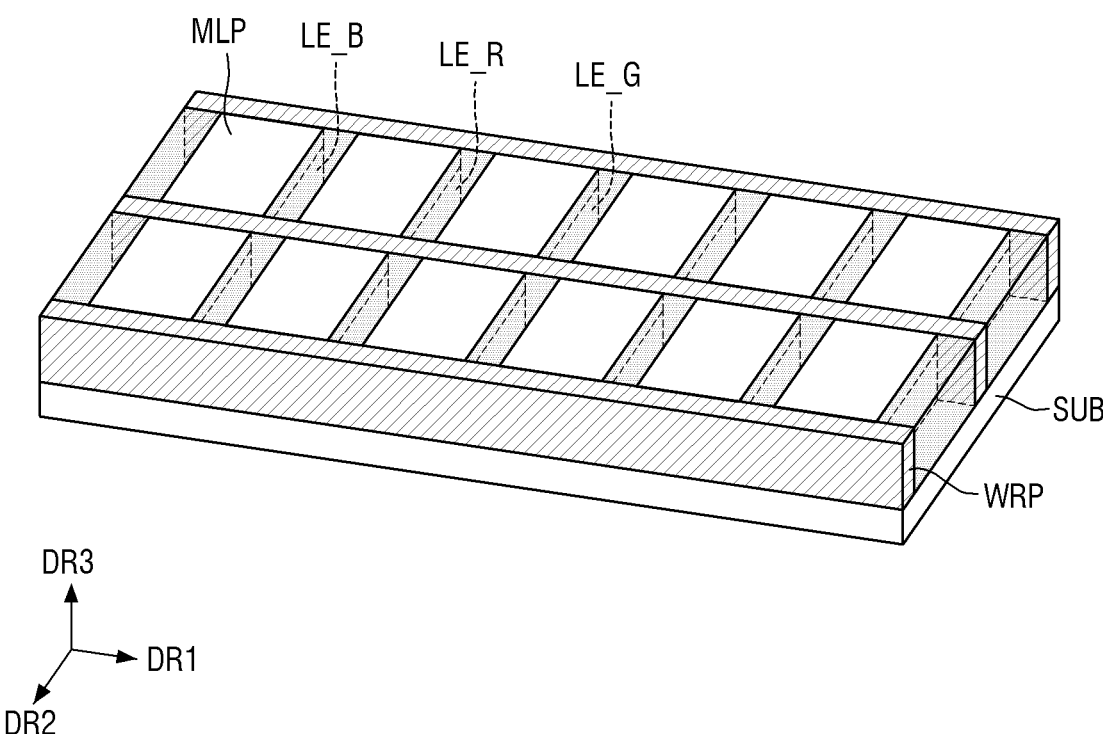

Thereafter, as shown in FIG. 23, the disposing of the light-emitting element layer EML may further include disposing reflecting portions WRP respectively on one side and the other side in the second direction DR2 of the light-emitting elements in a plan view, after disposing the light-emitting elements LE_B, LE_R, and LE_G, which are disposed in each pixel PX and configured to emit light, and the viewing angle control portions MLP respectively disposed on the light-emitting elements LE_B, LE_R, LE_G. The reflecting portions WRP have been described in detail above with reference to FIGS. 4 and 6 and, thus, will not be described herein.

Then, the disposing of the light-emitting element layer EML may further including filling and disposing light-transmitting portions TMP between the light-emitting elements LE_B, LE_R, and LE_G and the reflecting portions WRP in a plan view. The light-transmitting portions TMP have been described in detail above with reference to FIGS. 4 and 6 and, thus, will not be described herein.

Hereinafter, a display device according to another embodiment will be described.

FIG. 24 is a cross-sectional view of a light-emitting element layer of a display device according to another embodiment.

Referring to FIG. 24, a viewing angle control portion MLP_1 of a light-emitting element layer may include a plurality of layers L1 and L2 having different refractive indices from each other to reduce a vertical viewing angle of the display device to an angular range (e.g., a predetermined angular range) by adjusting light paths of light emitted in the third direction from each of the above-described light-emitting elements LE_B, LE_R, and LE_G. The viewing angle control portion MLP_1 may include a first layer L1 and a second layer L2 placed on the first layer L1. Each of the first and second layers L1 and L2 may be provided in plural. For example, the viewing angle control portion MLP_1 may include a plurality of first layers L1 and a plurality of second layers L2. The plurality of first layers L1 and the plurality of second layers L2 may be alternately stacked on each other along the thickness direction. For example, the number of layers in a stack of the first layers L1 and the second layers L2 may be three or more, and in some embodiments, five or more, but is not limited thereto.

For example, one second layer L2 may be directly disposed on a base substrate SSUB, one first layer L1 may be directly disposed on the second layer L2, and another second layer L2 may be directly disposed on the first layer L1. In one embodiment, the refractive index of the first layer L1 may be greater than the refractive index of the second layer L2. For example, a difference in refractive index between adjacent layers (e.g., adjacent first and second layers L1 and L2) may be approximately 0.3 or more. When the difference in refractive index between the adjacent first and second layers L1 and L2 is approximately 0.3 or more, the vertical viewing angle of the display device may be reduced to the angular range by adjusting the light paths of the light emitted in the third direction DR3 from each of the above-described light-emitting elements LE_B, LE_R, and LE_G.

FIG. 25 is a perspective view of a display device according to another embodiment. FIG. 26 is a cross-sectional view of the display device according to another embodiment. FIG. 27 is an enlarged cross-sectional view of the portion Q2 of FIG. 26. FIG. 28 is an enlarged cross-sectional view of the portion Q3 of FIG. 26. FIG. 29 is an enlarged cross-sectional view of the portion Q4 of FIG. 26.

Referring to FIGS. 25 to 29, a light-emitting element layer EML_1 of a display device according to the illustrated embodiment is different from the light-emitting element layer EML shown in FIG. 4 in that viewing angle control portions MLP_B, MLP_R, and MLP_G, which are respectively disposed on light-emitting elements LE_B, LE_R, and LE_G, are different from one another.

For example, the viewing angle control portions MLP_B, MLP_R, and MLP_G may include a first viewing angle control portion MLP_B, a second viewing angle control portion MLP_R, and a third viewing angle control portion MLP_G. The first viewing angle control portion MLP_B may be disposed on the first light-emitting element LE_B, the second viewing angle control portion MLP_R may be disposed on the second light-emitting element LE_R, and the third viewing angle control portion MLP_G may be disposed on the third light-emitting element LE_G. The viewing angle control portions MLP_B, MLP_R, and MLP_G disposed on different light-emitting elements LE_B, LE_R, and LE_G may have different thicknesses from one another. For example, the first viewing angle control portion MLP_B may have a first thickness TMLP_B, the second viewing angle control portion MLP_R may have a second thickness TMLP_R, and the third viewing angle control portion MLP_G may have a third thickness TMLP_G. In the illustrated embodiment, the first thickness TMLP_B may be smaller than each of the second thickness TMLP_R and the third thickness TMLP_G, and the second thickness TMLP_R may be greater than the third thickness TMLP_G. The first thickness TMLP_B may be smaller than each of the second thickness TMLP_R and the third thickness TMLP_G, and the second thickness TMLP_R may be greater than the third thickness TMLP_G in consideration of the wavelength range of light emitted from each of the light-emitting elements LE_B, LE_R, and LE_G, respectively disposed on lower portions of the viewing angle control portions MLP_B, MLP_R, and MLP_G. The wavelength range of the light emitted from the first light-emitting element LE_B may be smaller than the wavelength range of the light (e.g., the second light) emitted from the second light-emitting element LE_R and the wavelength range of the light (e.g., the third light) emitted from the third light-emitting element LE_G. The wavelength range of the light (e.g., the second light) emitted from the second light-emitting element LE_R may be greater than the wavelength range of the light (e.g., the third light) emitted from the third light-emitting element LE_G. In the illustrated embodiment, in consideration of the wavelength range of the light emitted from each of the light-emitting elements LE_B, LE_R, and LE_G respectively disposed on lower portions of the viewing angle control portions MLP_B, MLP_R, and MLP_G, the viewing angle control portions MLP_B, MLP_R, and MLP_G may be designed (or formed) such that the first thickness TMLP_B is smaller than each of the second thickness TMLP_R and the third thickness TMLP_G and the second thickness TMLP_R is greater than the third thickness TMLP_G. Accordingly, light path control for light emitted from each of the light-emitting elements LE_B, LE_R, and LE_G through each of the viewing angle control portions MLP_B, MLP_R, and MLP_G can be more easily performed. To design the viewing angle control portions MLP_B, MLP_R, and MLP_G such that the first thickness TMLP_B is smaller than each of the second thickness TMLP_R and the third thickness TMLP_G and the second thickness TMLP_R is greater than the third thickness TMLP_G, thicknesses T1_B and T2_B of a first layer L1_B and a second layer L2_B are designed (or formed) to be respectively smaller than thicknesses T1_R and T2_R of a first layer L1_R and a second layer L2_R and to be respectively smaller than thicknesses T1_G and T2_G of a first layer L1_G and a second layer L2_G, and the thicknesses T1_R and T2_R of the first layer L1_R and the second layer L2_R may be designed to be respectively greater than the thicknesses T1_G and T2_G of the first layer L1_G and the second layer L2_G.

In some embodiments, without adjusting the thickness of each layer, the thickness of each layer is designed to be the same for each viewing angle control portion MLP_B, MLP_R, and MLP_G, while the number of stacked layers constituting each viewing angle control portion MLP_B, MLP_R, and MLP_G may be different. For example, the number of stacked layers constituting the first viewing angle control portion MLP_B may be smaller than the number of stacked layers constituting the second viewing angle control portion MLP_R and the number of stacked layers constituting the third viewing angle control portion MLP_G and the number of stacked layers constituting the second viewing angle control portion MLP_R may be greater than the number of stacked layers constituting the third viewing angle control portion MLP_G.

According to the display device and the method of fabricating the display device in accordance with embodiments of the present disclosure, a vertical viewing angle may be controlled.

However, the aspects and features of embodiments of the present disclosure are not restricted to those set forth herein. The above and other aspects and features of embodiments of the present disclosure will become more apparent to one of ordinary skill in the art to which the embodiments pertain by referencing the claims.

In concluding the detailed description, those skilled in the art will appreciate that many variations and modifications can be made to the embodiments described herein without substantially departing from the principles of the present disclosure. Therefore, the disclosed embodiments of the present disclosure are used in a generic and descriptive sense and not for purposes of limitation.

What is claimed:

1. A display device comprising:
a substrate comprising a plurality of pixels; and
a light-emitting element layer on the substrate, the light-emitting element layer comprising:
light-emitting elements in each pixel, configured to emit light, and arranged along a first direction;
viewing angle control portions respectively on the light-emitting elements; and
reflecting portions respectively on one side and another side of the light-emitting elements in a second direction crossing the first direction in a plan view,
wherein each of the viewing angle control portions comprises a first layer having a first refractive index and a second layer having a second refractive index that is smaller than the first refractive index.

2. The display device of claim 1, wherein each of the first layer and the second layer is provided in plural.

3. The display device of claim 2, wherein the plurality of first layers and the plurality of second layers are alternately stacked on each other.

4. The display device of claim 3, wherein a difference between the first refractive index and the second refractive index is 0.3 or more.

5. The display device of claim 1, wherein the viewing angle control portions on the respective light-emitting elements are spaced apart from one another.

6. The display device of claim 1, wherein the reflecting portions comprise an opaque reflective material.

7. The display device of claim 6, wherein the opaque reflective material comprises resin comprising white-color-based pigments.

8. The display device of claim 7, wherein a reflectance of the reflecting portions with respect to the light emitted from each of the light-emitting elements is 80% or more.

9. The display device of claim 1, wherein the reflecting portions are in direct contact with adjacent ones of the light-emitting elements.

10. The display device of claim 1, wherein the light-emitting element layer further comprises light-transmitting portions filling between the light-emitting elements and the reflecting portions in a plan view.

11. The display device of claim 10, wherein the light-transmitting portions comprise transparent resin.

12. The display device of claim 10, wherein a light transmittance of the light-transmitting portions with respect to the light emitted from each of the light-emitting elements is 90% or more.

13. A display device comprising:
a substrate comprising a pixel, the pixel comprising a first sub-pixel, a second sub-pixel, and a third sub-pixel, the first to third sub-pixels being arranged in a first direction; and
a light-emitting element layer on the substrate, the light-emitting element layer comprising:
a first light-emitting element on the first sub-pixel;
a second light-emitting element on the second sub-pixel;
a third light-emitting element on the third sub-pixel;
a first viewing angle control portion on the first light-emitting element;
a second viewing angle control portion on the second light-emitting element;
a third viewing angle control portion on the third light-emitting element; and
reflecting portions respectively on one side and another side of the first light-emitting element, the second light-emitting element, and the third light-emitting element in a second direction crossing the first direction in a plan view, wherein each of the first viewing angle control portion, the second viewing angle control portion, and the third viewing angle control portion comprises a first layer having a first refractive index and a second layer having a second refractive index that is smaller than the corresponding first refractive index.

14. The display device of claim 13, wherein the first light-emitting element is configured to emit a first light, the second light-emitting element is configured to emit a second light, and the third light-emitting element is configured to emit a third light, and wherein a wavelength of the third light has a value between a wavelength of the first light and a wavelength of the second light, and the wavelength of the second light is greater than the wavelength of the first light.

15. The display device of claim 14, wherein the first viewing angle control portion has a first thickness, the second viewing angle control portion has a second thickness, and the third viewing angle control portion has a third thickness, and wherein the third thickness has a value between the first thickness and the second thickness, and the second thickness is greater than the first thickness.

16. The display device of claim 15, wherein each of the first viewing angle control portion, the second viewing angle control portion, and the third viewing angle control portion comprises a first layer having a first refractive index and a second layer having a second refractive index that is smaller than the first refractive index, wherein each of the first layer and the second layer is provided in plural, and wherein the plurality of first layers and the plurality of second layers are alternately stacked on each other.

17. The display device of claim 16, wherein a difference between the first refractive index and the second refractive index is 0.3 or more.

18. A method of fabricating a display device, the method comprising disposing a light-emitting element layer on a substrate, the substrate comprising a plurality of pixels, the disposing of the light-emitting element comprising:

disposing light-emitting elements in each pixel and arranged in a first direction, the light-emitting elements being configured to emit light, and disposing viewing angle control portions respectively on the light-emitting elements;

disposing reflecting portions respectively on one side and another side of the light-emitting elements in a second direction crossing the first direction in a plan view; and disposing and filling light-transmitting portions between the light-emitting elements and the reflecting portions in a plan view, wherein each of the viewing angle control portions comprises a first layer having a first refractive index and a second layer having a second refractive index that is smaller than the first refractive index.

19. The method of claim 18, wherein the disposing of the light-emitting elements and the viewing angle control portions comprises:

forming target light-emitting elements on one surface of a mother substrate;

disposing a viewing angle control layer on the other surface that is opposite to the one surface of the mother substrate; and disposing the light-emitting elements and the viewing angle control portions in each of the pixels by cutting the mother substrate and the viewing angle control layer.

* * * * *